US 6,771,540 B2

(12) United States Patent
Satoh et al.

(10) Patent No.: US 6,771,540 B2
(45) Date of Patent: Aug. 3, 2004

(54) NONVOLATILE SEMICONDUCTOR STORAGE DEVICE AND METHOD FOR OPERATING THE DEVICE

(75) Inventors: Akihiko Satoh, Hachioji (JP); Takayuki Kawahara, Higashiyamato (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/386,660

(22) Filed: Mar. 13, 2003

(65) Prior Publication Data

US 2003/0133329 A1 Jul. 17, 2003

Related U.S. Application Data

(62) Division of application No. 09/284,083, filed as application No. PCT/JP97/03716 on Oct. 15, 1997, now Pat. No. 6,580,643.

(30) Foreign Application Priority Data

Oct. 17, 1996 (JP) .............................................. 8-274865

(51) Int. Cl.[7] .......................... G11C 16/04; G11C 16/06

(52) U.S. Cl. ............................ 365/185.18; 365/185.22; 365/185.29

(58) Field of Search ....................... 365/185.18, 185.19, 365/185.22, 185.27, 185.29

(56) References Cited

U.S. PATENT DOCUMENTS

| | | | | | |
|---|---|---|---|---|---|
| 5,872,734 | A | * | 2/1999 | Tanaka et al. | 365/185.22 |
| 5,898,630 | A | * | 4/1999 | Madurawe | 365/185.18 |
| 5,901,084 | A | * | 5/1999 | Ohnakado | 365/185.18 |
| 5,999,444 | A | * | 12/1999 | Fujiwara et al. | 365/185.02 |
| 6,285,592 | B1 | * | 9/2001 | Kubota | 365/185.22 |

FOREIGN PATENT DOCUMENTS

JP 7-122091 * 5/1995

OTHER PUBLICATIONS

1994 IEEE Int'l Electron Devices Meeting, Digest of Technical Papers, 3.3, pp. 49–52.*
1995 Springtime Applied Physics Academy Scientific Lecture Meeting, 30p–R–6, p. 827.*

(List continued on next page.)

Primary Examiner—Trong Phan
(74) Attorney, Agent, or Firm—Antonelli, Terry, Stout & Kraus, LLP

(57) ABSTRACT

The present invention discloses a nonvolatile semiconductor memory device including a memory cell array composed of a plurality of memory cells, each of which is formed with a gate insulating film, a floating gate electrode, an insulating film between electrodes, and a control electrode formed respectively in a first conductor type semiconductor area, as well as a second conductor type source area and a second conductor type drain area formed respectively in the first conductor type semiconductor area, and programming and erasing data by controlling the amount of electrons in the floating gate electrode, wherein the nonvolatile semiconductor memory device further includes at least; means for applying a predetermined first operation voltage to the memory cell thereby to inject or eject electrons in or from the floating gate electrode; means for applying a second operation voltage to the memory cell after the application of the first operation voltage to give an electric field with a polarity opposite to that of the electric field applied with the application of the first operation voltage to an insulating film area around the floating gate through which electrons pass when the first operation voltage is applied; means for verifying the threshold voltage in the memory cell after the application of the second operation voltage; and means for deciding whether to repeat the operations following the application of the first operation voltage after the verify operation.

22 Claims, 21 Drawing Sheets

OTHER PUBLICATIONS

1994 IEEE Int'l Electron Devices Meeting, Digest of Technical Papers, 3.2, pp. 45–48.*

1992 IEEE Int'l Electron Devices Meeting, Digest of Technical Papers, p. 91–993.*

1992 IEEE Int'l Electron Devices Meeting, Digest of Technical Papers, pp. 599–602.*

1991 IEEE Int'l Electron Devices Meeting, Digest of Technical Papers, 11.4, pp. 307–310.*

1984 IEEE Int'l Electron Devices Meeting, Digest of Technical Papers, 17.3, pp. 464–467.*

1992 Symposium on BLSI Circuits, Digest of Technical Papers, pp. 24–25.*

* cited by examiner

| 1ST OPERATION VOLTAGE PULSE | $Vee=18V$ | $t11=10\,\mu sec$ |
| 2ND VOLTAGE PULSE | $Vrr=-14V$ | $t21=5\,\mu sec$ |

NONVOLATILE SEMICONDUCTOR STORAGE DEVICE AND METHOD FOR OPERATING THE DEVICE

This application is a Rule. 53(b) Divisional of application Ser. No. 09/284,083, filed Apr. 7, 1999, now U.S. Pat. No. 6,580,643, which is a 371 of PCT/JP97/03716 filed Oct. 15, 1997, the subject matter of which is incorporated herein by reference.

TECHNICAL FIELD

The present invention relates to a nonvolatile semiconductor storage device and a method for operating the nonvolatile semiconductor storage device, and more particularly to a nonvolatile semiconductor memory device enhanced for data retention characteristics, accuracy of program and erase operations.

BACKGROUND ART

For a nonvolatile semiconductor storage device in which each memory cell is composed of an FET transistor provided with a floating gate covered by an insulating film therearound and used as a charge storing layer, data is stored by controlling the amount of electrons stored in the floating gate thereby changing the threshold voltage of the transistor. When programming or erasing data into or from the memory cell, electrons are either injected or ejected from the floating gate via the insulating film.

Electron injection/ejection is possible by using the (Fowler-Nordheim (F-N)) tunnel phenomenon and the hot electron phenomenon. At this time, electrons are injected in the insulating film around the floating gate with the application of a high electrical field. Consequently, when the number of program/erase cycles is increased, the insulating film receives an electron injection stress repetitively, thereby degrading the insulating film. This results in the degradation of the various properties of the memory cell. Especially, when a low electrical field is applied to the insulating film that has been degraded due to such repetitive program/erase operations, the leakage current (low electric field leakage current or stress-induced leakage current) is increased. Consequently, the electron retention characteristics or the disturb characteristics of the memory cell are degraded. This degradation has now been questioned as a factor to limit the program/erase cycles for such a nonvolatile semiconductor memory device.

For example, Mr. Endoh and others disclosed a method, as described in the first related art example, for improving the read disturb characteristics of memory cells by suppressing the above mentioned stress-induced leakage current in the 1994 International Electron Devices Meeting 3.3, and in the 1995 Springtime Applied Physics Academy Scientific Lecture Meeting (30p-R-6). Hereunder, the outline of this method will be described with reference to FIG. 4.

FIG. 4(a) is a timing flow of voltages applied to a memory cell in an erase operation. FIG. 4(b) is a cross sectional view of a memory cell. In the first related art example, data is programmed/erased in a memory cell by injecting/ejecting electrons in/from the floating gate 42 via the gate insulating film 46 rising the F-N tunnel phenomenon. In this example, ejection of electrons from the floating gate 42 is defined as an erase operation. If this erase operation is repeated many times using the F-N tunnel phenomenon, the gate insulating film 46 of each memory cell is degraded as described above, and as a result, the stress-induced leakage current is increased. In this first related art example, it is considered that an increase of the stress-induced leakage current occurs via many trap sites formed in the insulating film along with the progress of the degradation of the gate insulating film.

Therefore, in order to prevent this stress-induced leakage current in the first related art example, an erase operation is performed as to be described later, in order to deactivate trap sites as follows.

At first, the control gate is set to the ground potential and a predetermined positive erase voltage Vee is applied to the substrate 45, the source 43, and the drain 44 of an object memory cell. Then, electrons are ejected from the floating gate toward the substrate 45 via the gate insulating film 46 using the F-N tunnel phenomenon, thereby setting the threshold voltage of the memory cell to a predetermined erase level. At this time, trap sites in the gate insulating film 46 are activated by the applied high voltage Vee.

Immediately following this erase operation, a positive voltage Vgg is applied to the control gate 41 for a sufficient amount of time to deactivate the trap sites. The voltage Vgg must be a voltage that can suppress a program operation, that is, a low voltage that can suppress the variation of the threshold voltage from a predetermined erase level. The voltage Vgg must also have the same polarity as that of the read operation, and have a larger voltage than the voltage in the read operation.

With this application of the positive low voltage Vgg, the number of trap sites active in the read operation is reduced at the phase boundary between the gate insulating film 46 and the substrate 45, as well as near the phase boundary. And accordingly, the stress-induced leakage current is reduced, thereby making it possible to suppress the variation of the threshold voltage caused by a read operation and improve the read retention characteristics after that.

In a memory cell whose gate insulating film is degraded due to repetitive program/erase operations, however, a variation of the threshold voltage also occurs due to a leakage of many electrons trapped in the gate insulating film in addition to an increase of the stress-induced leakage current. Mr. Kato and others made this clear (referred to in the 1994 International Electron Devices Meeting 3.2).

It is well known that many charged trapping centers are formed in the gate insulating film depending on the program/erase operation method if the program/erase operation is repeated. When electrons pass through the insulating film during program/erase operation, some of the electrons are trapped by those charged trapping centers. Those trapped electrons leak more easily out of the insulating film than the electrons stored in the floating gate. The threshold voltage of the memory cell is thus varied sharply and quickly after a program/erase operation, thereby affecting the data retention characteristics significantly. Therefore, in order to improve the data retention characteristics of the memory cell, it is very important to reduce both the trapped electrons in the insulating film 46 and the stress-induced leakage current.

FIG. 13 shows the distribution of electrons trapped in the gate insulating film 46 during an erase operation of the first conventional technology. FIG. 13(a) is an explanatory view of the electron distribution when an erase voltage Vee is applied toward the substrate 45, and FIG. 13(b) shows an explanatory view of the electron distribution when a positive-low voltage Vgg is applied toward the control gate 41 after the application of the erase voltage. As shown in FIG. 13(a), when the erase voltage Vee is applied, some of the electrons ejected from the floating gate 42 to the gate insulating film 46 are trapped by the charged trapping centers existing near the floating gate 42 in the gate insulating film 46. In addition, electron ejection occurs near the phase boundary of the substrate in the gate insulating film 46 occurs electron ejection.

Consequently, the distribution of trapped electrons becomes as follows; too many electrons gather at the floating gate 46 side and fewer electrons gather at the substrate 45 side (or holes are excessive). If the application of the erase voltage Vee is finished in such a distribution state, too many electrons or holes are distributed in the gate insulating film 46, and as a result the inner electric field becomes a dominant force. Electrons or holes are then ejected from the gate insulating film 46 to ease this dominant force. This phenomenon, however, invites a variation of the threshold voltage, which will reduce the margin between the threshold voltage and the program level of a memory cell from which data is erased. As a result, the data retention characteristics of the memory cell is degraded.

In the first related art example, trap sites are deactivated with a positive low voltage Vgg, which is applied after the application of an erase voltage Vee to suppress the stress-induced leakage current. The voltage Vgg is a little higher than that in the read operation. In this case, trapped electrons in the gate insulating film are also ejected in small amounts. However, since the electric field applied to the gate insulating film with the low voltage Vgg is as low as about 3 to 5 MV/cm, it is impossible to eject the electrons trapped in the insulating film satisfactorily with a high electric field applied in program and erase operations.

Furthermore, each of general nonvolatile semiconductor memory devices includes a memory cell array composed by integrating many memory cells. In this case, generally, the erase characteristics of each memory cell are varied due to a process variation, and also due to a degradation tendency variation with respect to repetitive program/erase operations. In other words, the amount of electrons that will be trapped in an insulating film during an erase operation, as well as the threshold voltage variation characteristics after an erase operation may be varied among memory cells. If a voltage Vgg is applied again to memory cells from which data has already been previously erased, just like in the first related art example, some of those memory cells will not be able to secure a predetermined level threshold voltage, since a program operation is executed in them and trapped electrons are ejected from them as described above. Therefore, in order to prevent such problems, an operation is needed to verify the threshold voltage after the low voltage Vgg is applied. If there are any memory cells in which the threshold voltage does not satisfy a predetermined erase level after the low voltage Vgg is applied, another erase operation must be executed. In the case of the first conventional technology, in which the low voltage Vgg is applied only once after an erase operation is finished, however, it is impossible to prevent such a variability.

Next, the nonvolatile semiconductor memory device in the second related art example will be described. This device is disclosed in the official gazette of Japanese Unexamined Patent Publication No. 7-122091. In the second related art example, the program characteristics are recovered by suppressing the trapping of electrons in the insulating film, which is caused by repetitive program/erase operations. Hereunder, the outline of this operation method will be described with reference to FIG. 5.

FIG. 5(*a*) is a flow chart indicating an erase operation in the second related art example. FIG. 5(*b*) is a cross sectional view of a memory cell with respect to the voltages applied for programming. The nonvolatile semiconductor memory device in this second related art example has program, read, erase, and stress apply modes. For a program operation for such a memory device, the substrate 45 and the source 43 are set to the ground potential, a predetermined positive voltage Vd is applied to the drain 44 and a high voltage VPP is a applied to the control gate 41. The, hot electrons generated with a high electric field applied between the source 43 and the drain 44 are injected in the floating gate via an area near the drain 44 of the gate insulating film 46 using a high voltage Vpp applied to the control gate 41, as shown in FIG. 5(*b*). At this time, some of the injected electrons are trapped in the gate insulating film 46. Therefore, as program/erase cycles are repeated, the electrons trapped in an area around the drain 44 of the gate insulating film 46 are increased, and, as a result, those trapped electrons ease the electric field of the gate insulating film 46 in the vertical direction during a program operation and slow down the program operation.

Therefore, in order to avoid such a problem, in the case of an erase operation in the second related art example, the stress apply mode is set after a program operation is performed first, in order to eject electrons trapped in the gate floating film 46 to the floating gate 42 as shown in FIG. 5(*a*). The object erase operation is executed after this. The stress apply mode mentioned here refers to a mode in which, for example, the substrate 45 and the source 43 are opened. The supply voltage Vcc is applied to the drain 44 and a high voltage Vpp is applied to the control gate 41. By ejecting trapped electrons beforehand in such a way, it is possible to keep the original program operation speed in the subsequent program operations.

However, in the case of the second related art example, shown in FIG. 5(*a*) , a program operation is executed, and the stress apply mode is set to eject the electrons trapped in the gate insulating film 46 to the floating gate 42. An object erase operation is executed after this. The erase operation is then verified. In such an operation method, when an erase operation is executed, electrons are trapped again in the gate insulating film 46.

Those trapped electrons come to affect the threshold voltage read in such a verify operation. This makes it impossible to suppress the variation of the threshold voltage caused by the leakage of those trapped electrons. In addition, in the case of the second related art operation method, an operation for applying a stress of 1 to 20 ms is added in addition to a program operation, an object erase operation, and a verify operation for the erase operation. However, this causes another problem of increasing the erasing time.

DISCLOSURE OF THE INVENTION

As described above, the first related art technology deactivates trap sites by applying a positive low voltage Vgg in order to suppress the stress-induced leakage current after an erase voltage Vee is applied. The voltage Vgg is set a little higher than that applied in read operations. At this time, some of the trapped electrons are also ejected from the gate insulating film 46. However, since the electric field applied to the gate insulating film 46 with the voltage Vgg is as low as about 3 to 5 MV/cm, it is impossible to eject the trapped electrons from the gate insulating film 46 satisfactorily within a short time with the high electric field that is applied during program and erase operations.

If a low voltage Vgg is applied again to memory cells for which an erase operation has already been performed once, just like in the first related art example, some memories cannot secure a predetermined erase level threshold voltage. This is because a program operation is performed or trapped electrons are ejected as described above. Therefore, in order to avoid such a problem, the threshold voltage must be verified after the low voltage Vgg is applied. If there are any memory cells in which the threshold voltage does not satisfy the predetermined erase level after the voltage Vgg is applied, an erase voltage Vee must further be applied. The first related art operation method, in which the low voltage Vgg is applied only once after an erase operation is finished cannot prevent this variation of the threshold.

In the case of the second related art operation method, an erase operation performed in the stress apply mode as described above, allows electrons to be trapped again in the gate insulating film 46. Consequently, the threshold voltage read in the verify operation performed after the erase operation is affected by those trapped electrons. It is thus impossible for the related art operation method to suppress the variation of the threshold voltage caused by the leakage of the trapped electrons.

In the second related art operation method, another problem also arises of increasing the erasing time, since an erase operation in this method requires an additional operation for applying a stress of 1 to 20 ms in addition to a program operation, an object erase operation, and a verify operation.

Under such circumstances, it is an object of the present invention to provide, a nonvolatile semiconductor memory device that can eject electrons trapped in the gate insulating film within a shorter time than the related art method and suppress the variation of the threshold voltage even when characteristics are varied among memory cells, as well as provide a method for operating such a nonvolatile semiconductor memory device.

The nonvolatile semiconductor memory device of the present invention has a memory array consisting of a plurality of memory cells, each being formed with a gate insulating film, a floating gate electrode, an insulating film between electrodes, and a control gate electrode formed respectively in a first conductor type semiconductor area, as well as a second conductor type source area, and a second conductor type drain area formed, respectively, in the first conductor type semiconductor area, wherein program and erase operations are performed by controlling the amount of electrons in the floating gate electrode.

The nonvolatile semiconductor memory device of the present invention further includes at least means for applying the predetermined first operation voltage to each of the memory cells in order to inject or eject electrons in or from the floating gate electrode; means for applying the second operation voltage to the memory cell after the application of the first operation voltage to give an electric field with a polarity opposite to that of the electric field, given with the application of the first operation voltage to the insulating film area around the floating gate through which electrons pass when the first operation voltage is applied; means for verifying the threshold voltage of the memory cell after the second operation voltage is applied; and means for deciding whether to repeat the above operations following the application of the first operation voltage after the verify operation.

The method for operating the nonvolatile semiconductor memory device of the present invention, which has a memory cell array consisting of a plurality of memory cells, each of which is formed with a gate insulating film, a floating gate electrode, an insulating film between electrodes, and a control gate electrode formed respectively in a first conductor type semiconductor area. A second conductor type source area and a second conductor type drain area are also formed respectively in the first conductor type semiconductor area, wherein program and erase operations are performed by controlling the amount of electrons in the floating gate electrode. This comprises a process for applying the predetermined first operation voltage to the memory cell in order to inject or eject electrons in or from the floating gate electrode; a process for applying the second voltage to the memory cell after the application of the first operation voltage to give an electric field of a polarity opposite to that of the electric field given with the application of the first operation voltage to the insulating film area around the floating gate through which electrons pass when the first operation voltage is applied; a process for verifying the threshold voltage of the memory cell after the second operation voltage is applied; and a process for deciding whether to repeat the above operations following the application of the first operation voltage after the verify operation, in order to execute program and erase operations.

In this case, the second operation voltage should give an electric field of at least 7 MV/cm in absolute value to the insulating film area around the floating gate, and the pulse width of the second voltage should preferably be shorter than that of the first operation voltage.

The process for applying the second operation voltage to the memory cell should be executed when the number of program/erase cycles exceeds a predetermined amount.

In addition, each time the process for applying the first operation voltage to the memory cell is repeated by a predetermined amount, the pulse width of both the first and second operation voltages may be increased.

In this case, the process for increasing the pulse width of the second operation voltage may be executed until the pulse width of the second operation voltage reaches a predetermined value.

It is also possible that each time the process for applying the first operation voltage to the memory cell is repeated by a predetermined amount, a process for increasing the peak value of both the first and second operation voltages may be added.

In this case, the process for increasing the peak value of the second operation voltage may be executed until the peak value of the second operation voltage reaches a predetermined value.

In addition, the first operation voltage should preferably be applied to a predetermined word line, that is, a selected word line has a positive polarity voltage with respect to the ground potential, and the ground potential or a negative potential with respect to the substrate should be applied the ground potential, and the second operation voltage should be applied to the word line as a negative polarity voltage with respect to the ground potential.

It is also possible to apply the first operation voltage to a predetermined word line, that is, a selected word line, as a positive polarity voltage with respect to the ground potential, and the substrate should be applied the ground potential or a negative potential with respect to the ground potential, and the second operation voltage should be applied to the substrate as a positive polarity voltage with respect to the ground potential.

It is also possible to apply that the first operation voltage to the substrate as a positive polarity voltage with respect to the ground potential, and the second operation voltage is applied to one word line or to a plurality of word lines as a positive polarity voltage with respect to the ground potential.

It is also possible to apply the first operation voltage to a predetermined word line, that is, a selected word line, as a negative polarity voltage with respect to the ground potential, and the substrate is applied the ground potential or a negative potential with respect to the ground potential, and the second operation voltage is applied to the word line as a positive polarity voltage with respect to the ground potential.

It is possible that in each memory cell, the peak value or the pulse width of the second operation voltage is varied according to the program level that is set so as to allow information of a plurality of bits to be stored in the memory cell by setting the threshold voltage to any of a plurality of predetermined program or erase levels.

Hereunder, the preferred embodiments of the nonvolatile semiconductor memory device of the present invention, as well as its operation method will be described.

The nonvolatile semiconductor memory device of the present invention has a memory array consisting of a plurality of memory cells disposed in a matrix. Each of those memory cells is provided with a floating gate electrode formed in a first conductor type semiconductor area via a gate insulating film, and with a second conductor type source area and a second conductor type drain area formed respectively in the first conductor type semiconductor area. Data is programmed and erased in each memory cell of the nonvolatile semiconductor memory device by controlling the amount of electrons in this floating gate electrode. The nonvolatile semiconductor memory device of the present invention also includes at least: a circuit for generating a predetermined first operation voltage for injecting or ejecting electrons in or from the floating gate electrode, that is, a predetermined program/erase voltage to be applied to a selected memory cell; a circuit for generating a second operation voltage for giving an electric field to the selected memory cell with a polarity opposite to that of the electric field, given with the application of the first operation voltage to the insulating film area around the floating gate electrode through which electrons pass when the first operation voltage is applied; a circuit for generating a voltage to verify the threshold voltage of the memory cell after the second operation voltage is applied, that is, a circuit for generating a verification; and a circuit for deciding whether to repeat the above operations following the application of the first operation voltage after the verify operation by checking to see if the program/erase level for the memory cell is within a predetermined threshold voltage, that is, a circuit for deciding a program/erase level.

The method for operating the nonvolatile semiconductor memory device of the present invention applies a predetermined first voltage generated in the first operation voltage generating circuit to a selected memory cell, and then applies a predetermined second voltage generated in the second operation voltage generating circuit to the selected memory cell, then applies a verify voltage generated by the verify voltage generating circuit to the selected memory cell in order to make a verify operation. In addition, if the threshold voltage of the memory cell is not within a predetermined value after the verification, the operations following the application of the first operation voltage are repeated.

With an execution of this operation method of the present invention, electrons trapped in the insulating film during the application of the first operation voltage are ejected with the application of the second operation voltage before the verification. The nonvolatile semiconductor memory device of the present invention can thus suppress the variation of the threshold voltage of each memory cell, which is caused by a leakage of the trapped electrons, as well as improve the data retention characteristics.

BRIEF DESCRIPTION OF DRAWINGS

FIG. 4 shows the first related art example.

FIG. 5 shows the second related art example.

FIG. 7 shows the result of a comparison between the erase operation method of the present invention and the related art example.

FIG. 15 shows the nonvolatile semiconductor memory device of the present invention and its operation method in yet another embodiment.

FIG. 16 shows the nonvolatile semiconductor memory device of the resent invention and its operation method in still another embodiment.

FIG. 17 shows the nonvolatile semiconductor memory device of the present invention and its operation method in yet another embodiment.

FIG. 18 shows the nonvolatile semiconductor memory device of the present invention and its operation method in still another embodiment.

FIG. 19 shows an application of the operation method for the nonvolatile semiconductor memory device of the present invention.

FIG. 21 is the nonvolatile semiconductor memory device of the present invention in yet another embodiment.

FIG. 22 is the nonvolatile semiconductor memory device of the present invention and its operation method in still another embodiment.

BEST MODE FOR CARRYING OUT THE INVENTION

Next, embodiments of the nonvolatile semiconductor memory device of the present invention and its operation method will be described in greater detail with reference to the accompanying drawings.

<First Embodiment>

Figure 2:
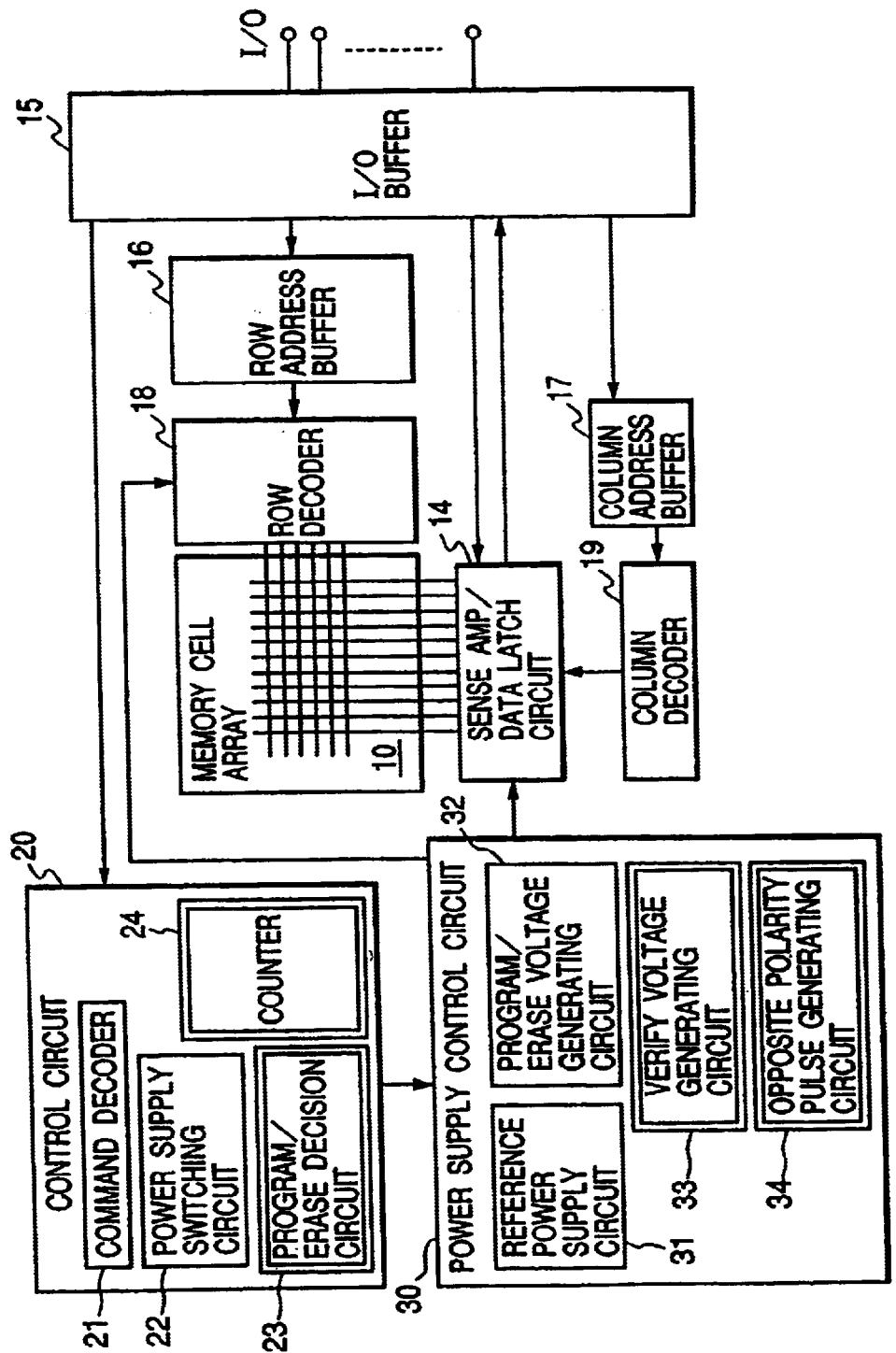
FIG. 2 is a block diagram of the major portion of the nonvolatile semiconductor memory device of the present invention in an embodiment.

FIG. 2 is a circuit block diagram indicating the major portion of the circuit configuration of the nonvolatile semiconductor memory device of the present invention. In FIG. 2, 10 is a memory cell array. A row decoder 18 for selecting a word line is connected to this memory array 10. A column decoder 19 is also connected to the memory cell array 10 via a sense amplifier/data latch circuit 14. An input/output buffer 15 is connected to the row decoder 18 via a row address buffer 16, and the column decoder 19 via a column address buffer 17, respectively. The input/output buffer 15 is also connected to the sense amplifier/data latch circuit 14, as well as to a control circuit 20. The control circuit 20 is connected to the row decoder 18 and to the sense amplifier/data latch circuit 14 via a power supply control circuit 30.

Figure 4A:
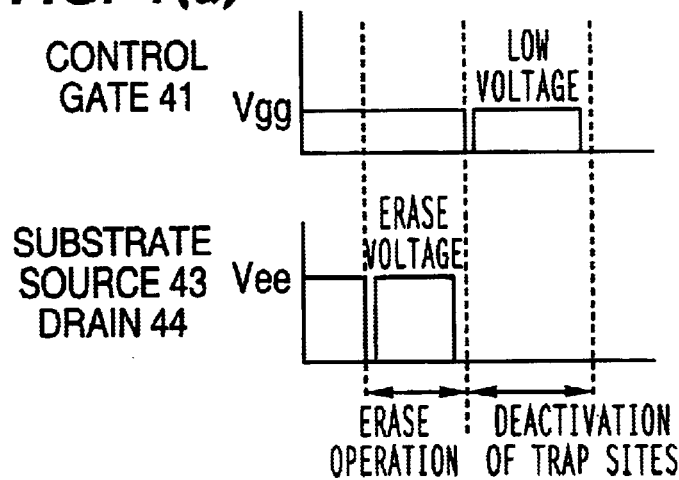
FIG. 4(a) is a timing flow chart of applied voltages during an erase operation.
Figure 4B:
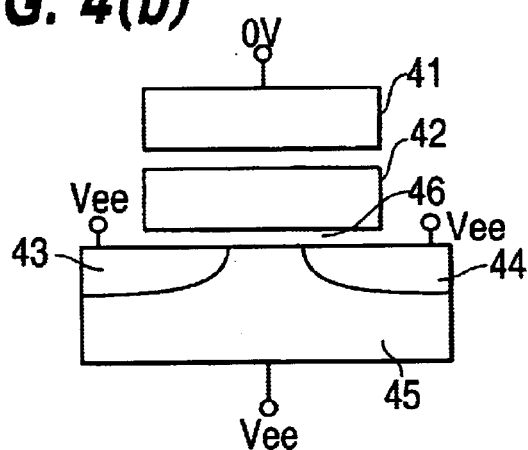
FIG. 4(b) is a cross sectional view of a memory cell.
Figure 6:
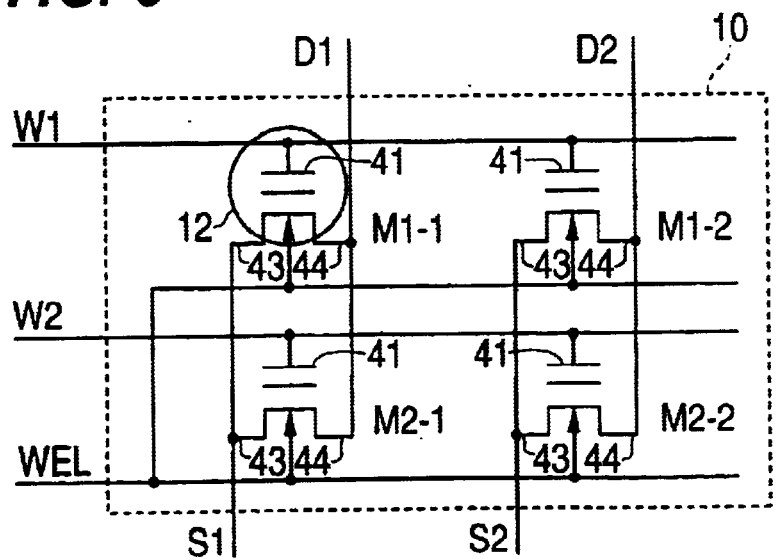
FIG. 6 is a circuit diagram indicating a memory cell array in which a plurality of memory cells are disposed in a matrix and connected to each other in parallel.
Figure 5A:
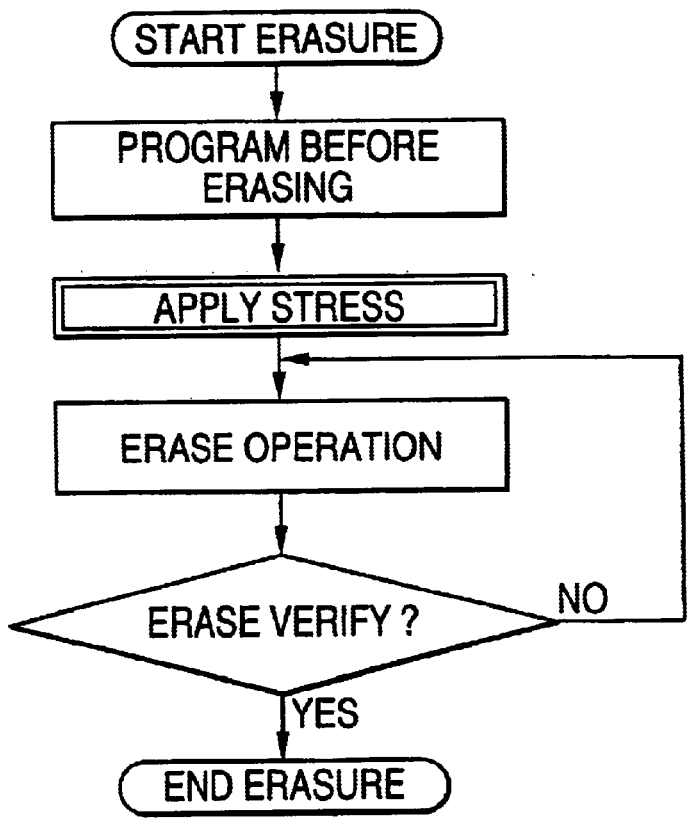
FIG. 5(a) is a flow chart of an erase operation.
Figure 5B:
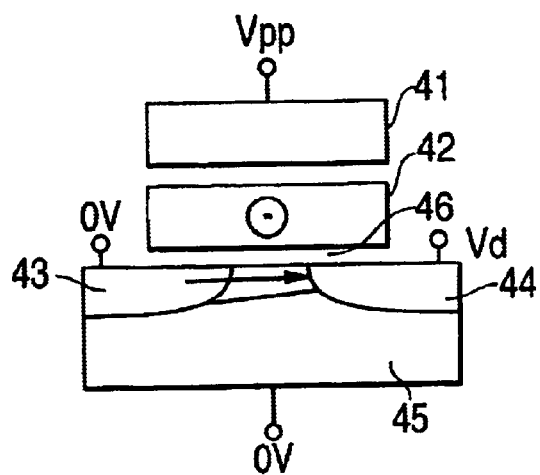
FIG. 5(b) is a cross sectional view of a memory cell during a program operation.

FIG. 6 shows a configuration of the memory cell array shown in FIG. 2. A plurality of memory cells 12 are disposed in a matrix in the memory cell array 10 shown in FIG. 6. Each memory cell 12 is composed of an n-channel MOS transistor having a floating gate formed in the same manner as that of the related art shown in FIG. 4(b). Each memory cell 12 is structured in the same manner as that of the first related art example shown in FIG. 4(b). Thus, the same reference numerals are used for the same items as those in the related art example, in order to avoid redundant description.

As shown in FIG. 6, the control gate 41 of each of the memory cells M1-1 and M1-2 is connected to a word line W1, and the control gate of each of the memory cells M2-1 and M2-2 is connected to a word line W2. The drain 44 of each of the memory cells M1-1 and M2-1 is connected to a data line D1, and the drain 44 of each of the memory cells M1-2 and M2-2 is connected to a data line D2. The source 43 of each of the memory cells M1-1 and M1-2 is connected to a local source line S1, and the source 43 of each of the memory cells M1-2 and M2-2 is connected to a local source line S2.

In this embodiment, a plurality of memory cells 12 are connected to each other in parallel as shown in FIG. 6, and they are disposed in a matrix. However, the method of disposing those memory cells can be varied freely. In addition, although memory cells 12 are shown only for 4 bits in FIG. 6, the number of word s lines, the number of data lines, and the number of memory cells 12 can be varied freely. Furthermore, if those memories 12 are formed in a well (not shown) formed on the substrate, they may be connected to a well line WEL which is connected to a common well. This well may be divided into different regions to be driven separately. If no well is to be formed, the well line WEL is connected to the substrate. In addition, each memory cell may be composed of a p-channel MOS transistor.

As shown in FIG. 2, the control circuit 20 is composed of a command decoder 21, a power supply switching circuit 22, a program/erase deciding circuit 23, and a counter 24. The power supply control circuit 30 is composed of is a reference voltage generating circuit 31, a program/erase voltage generating circuit 32, and a verify voltage generating circuit 33. The reference voltage generating circuit 31 generates a reference voltage to be injected into each circuit so as to generate a predetermined voltage, such as the program/erase voltage generating circuit 32, the verify voltage generating circuit 33, the opposite polarity pulse generating circuit 34, etc. Operations of the program/erase deciding circuit 23 will be described below with respect to FIGS. 1, 8, 9 and 10. As will be described, after verifying the threshold voltage of each of the memory cells, the circuit 23 may decide whether or not to apply the erase pulse/write again. The counter 24 is not used in this embodiment, so it may be omitted.

Hereunder, the operation method for the nonvolatile semiconductor memory device composed in such a way will be described with reference to an erase operation. In this embodiment, the erase operation is defined as an operation for injecting electrons into the floating gate 42 of each memory cell composed of an n-channel MOS transistor in order to raise the threshold voltage thereof. Of course, the definition of the erase operation is not limited only to this. The erase operation may also be defined as an operation for ejecting electrons from the floating gate 42 of each memory cell in order to lower the threshold voltage thereof. In addition, the operation method for the nonvolatile semiconductor memory device of the present invention may also apply not only to erase operations, but also to program operations.

In FIG. 2, the erase command entered from the input/output buffer 15 is converted to a control signal by a command decoder 21 provided in the control circuit 20. This control signal controls the power supply switching circuit 22 in order to change the output of the program/erase voltage generating circuit 32 provided in the power supply control circuit 30 to a predetermined erase voltage Vee used for an erase operation. Consequently, the erase voltage Vee is supplied to the row decoder 18.

On the other hand, the row address signal entered from the input/output buffer 15 is entered into the row decoder 18 via the row address buffer 16, and then decoded to a word line drive signal. A predetermined word line Wn (W1 or W2 in FIG. 6) selected by this word line drive signal is driven by a word driver, etc., and therefore the erase voltage Vee, which is the first operation voltage, is applied to the control gate 41 of the desired memory cell 12 via the word line Wn. The data line Dn, the source line Sn, and the well line WEL are also selected by a column address signal respectively entered into the column decoder 19 from the input/output buffer via the column address buffer 17 as described above. The control gate of the memory cell 12 also receives a predetermined voltage from the power supply control circuit 39, according to a command entered to the control circuit 20 from the input/output buffer 15, and thereby the ground potential is applied to the drain 44, the source 43, and the well of the memory cell 12.

Figure 1A:
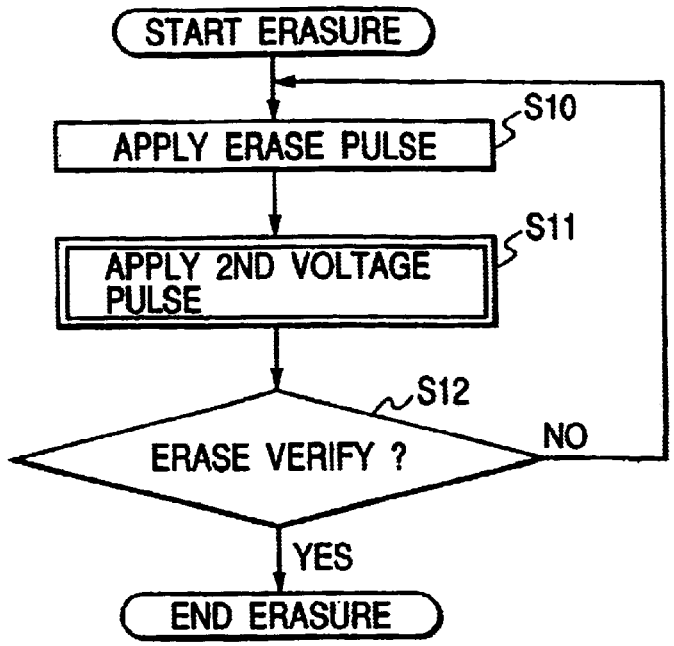
FIG. 1 is an operation flow chart and an operation timing chart indicating an embodiment of the nonvolatile semiconductor memory device of the present invention and a method for operating the nonvolatile semiconductor memory device.
Figure 20:
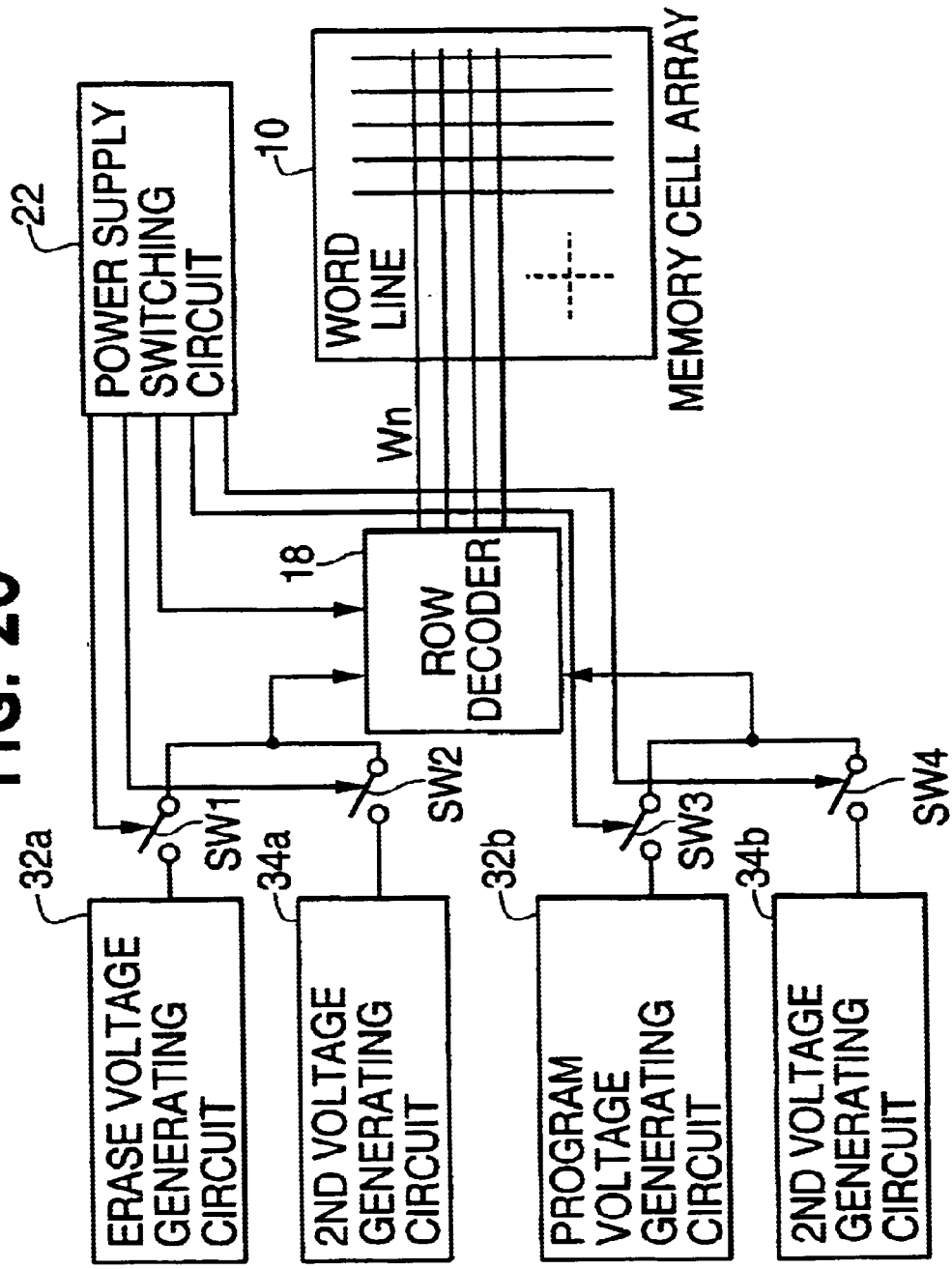
FIG. 20 is a circuit diagram of the major portion of the circuit diagram shown in FIG. 2, which explains the operation flow shown in FIG. 1(a).

FIG. 1($a$) is a flow chart of an erase operation in this embodiment, and FIG. 1($b$) is a timing flow of the voltages Vcg and Vd applied to the control gate 41 and the drain 44 of the memory cell 12 in the erase operation flow. In FIG. 1($b$), the voltage Vdv is a verify voltage pulse. The method for applying a voltage to each memory cell is not limited to this alone. For example, a voltage may be applied to the substrate 45. In addition, the strength and pulse width of the applied voltage may be varied freely. FIG. 20 is part of the circuit block diagram shown in FIG. 2. It shows the memory cell array 10, the power supply switching circuit 22, the row decoder 18, the program/erase voltage generating circuit 32, and the opposite polarity pulse generating circuit 34 in order to explain the circuit configuration with respect to the operation flow shown in FIG. 1($a$). In FIG. 20, the program/erase voltage generating circuit 32 is divided into an erase voltage generating circuit 32$a$ and a program voltage generating circuit 32$b$, and the opposite polarity pulse generating circuit 34 is divided into second voltage generating circuits 34$a$ and 34$b$.

For an erase operation, at first, the switch SW1 is closed for the word line Wn selected by the row decoder 18, according to a signal from the power supply switching circuit 22 in step S10. Consequently, the word line Wn is connected to the erase voltage generating circuit 32$a$ and a voltage Vee erase pulse whose pulse width is t11 (e.g., Vee=18V, t11=10 $\mu$s), that is, the first operation voltage pulse is applied to the control gate. At this time, in each of a plurality of memory cells 12 sharing the word line Wn, a positive high voltage Vee is applied to the control gate 41. Electrons are injected into the floating gate 42 of each memory cell via the gate insulating film 46 from the substrate 45 (WEL if it is provided), due to the F-N tunnel phenomenon. And accordingly, the threshold voltage of the memory cell is raised. At this time, the switches SW2 to SW4 are kept open.

After this, the switch SW2 is closed, according to a signal from the power supply switching circuit 22, and thereby the word line Wn is connected to the second voltage generating circuit 34$a$ in step SI 1. A voltage pulse whose polarity is opposite to the polarity of the first operation voltage is thus applied to the word line Wn. The voltage pulse is a negative voltage Vrr whose pulse width is t21 (e.g., Vrr=−14V, t21=5 $\mu$s), that is, the second voltage pulse. At this time, the switches SW1, SW3, and SW4 are kept open.

Figure 14:
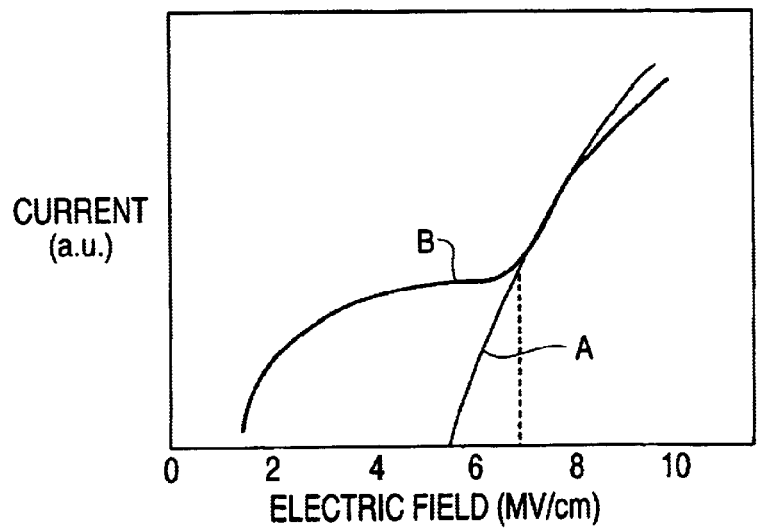
FIG. 14 is a characteristics diagram indicating the current—electric field characteristics of a gate insulating film before and after an electron injection stress is applied.
Figure 13A:
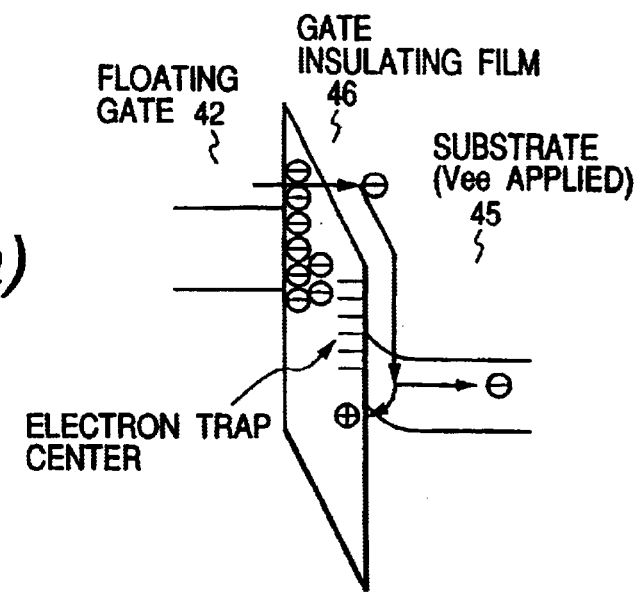
FIG. 13(a) shows a distribution when an erase voltage is applied and FIG. 13(b) indicates a distribution when a positive voltage Vgg is applied.
Figure 13B:
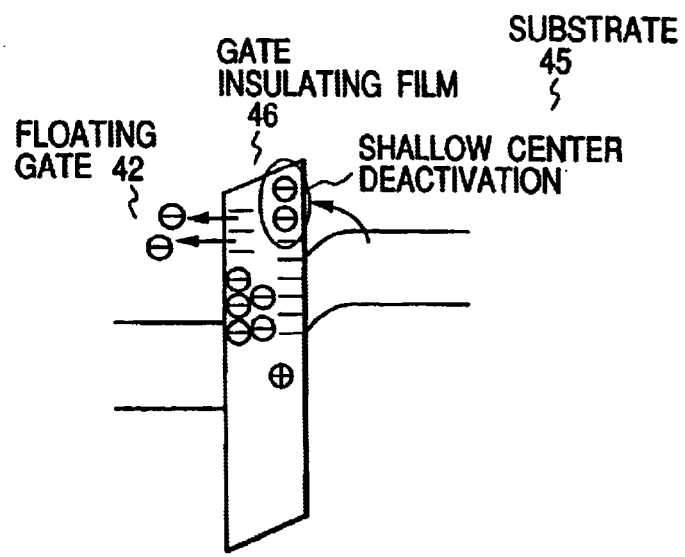
FIG. 13 is an explanatory view of a distribution of trapped electrons in a gate insulating film during an erase operation using the operation method of the first related art example.

The second voltage Vrr is set so that an electric field whose absolute value is at least about 7 MV/cm is applied to the gate insulating film of the memory cell 12 with a polarity opposite to that of the applied first operation voltage Vee. With the application of such an opposite polarity high voltage, the electrons trapped in the gate insulating film 46 can be ejected. The application of this opposite polarity high voltage will be described below in greater detail. FIG. 14 is a characteristics diagram indicating the current—electric field characteristics before and after an electron injection stress is applied to a thermal oxide film of about 10 nm in thickness. In FIG. 14, A shows the characteristic curve before the electron injection stress, and B shows the characteristic curve after the electron injection stress. It is well known that the low electric field leakage current of A increases as compared with the low electric field leakage current of B in a low electric field and the F-N tunnel current of A decreases only a little as compared with the F-N tunnel current of B in high electric field. This low electric field leakage current includes an element equivalent to the trapped electron leakage described above. Consequently, in order to eject trapped electrons from the thermal oxide film satisfactorily within a short time by applying an opposite polarity voltage, an electric field must be applied of at least 7 MV/cm or more to the thermal oxide film to which the electron injection stress is applied.

Next, a predetermined potential is applied to the word line Wn, as well as data and source lines to verify the threshold voltage of each of the memory cells 12 connected to the word line Wn. The output of the data line is then amplified by the sense amplifier 14 and compared with a reference value. In other words, an object switch (not shown) is closed, according to a signal from the power supply switching circuit 22 in step S12, in order to connect the word line Wn to the verify voltage generating circuit 33 and apply a predetermined positive verify voltage Vdv to the drain 44 of the memory cell 12, and a predetermined positive verify gate voltage Vthv to the control gate 41 of the memory cell 12. The voltage Vthv contains an expected margin for a predetermined erase threshold voltage. The program/erase deciding circuit 23 may determine "YES" or "NO" in step S12. At this time, the switches SW1 to SW4 are kept open. If the object memory cell transistor is turned on in the verification, that is, if there is a memory cell 12 whose voltage does not reach a predetermined erase level, control returns to step S10, in which an erase pulse is once again applied to the word line Wn. If the object memory cell transistor is off, the same erase operation is repeated for each of the memory cells connected to the selected word line Wn. When the erase operation is completed for all of those memory cells connected to the selected word line Wn, the erase operation is ended.

In such an erase operation in this embodiment, since the erase voltage Vee is applied to the control gate 41 of each memory cell, then the high voltage Vrr is applied to the control gate 41 with a polarity opposite to that of the erase voltage, and thereby it is possible to eject the electrons trapped in the gate insulating film 46 with the application of the erase voltage Vee. This embodiment can thus suppress the variation of the threshold voltage in each memory cell, which is caused by a leakage of trapped electrons after the erase operation is executed.

When the high voltage Vrr is applied with a polarity opposite to that of the erase voltage, trapped electrons may be distributed in the gate insulating film 46, unlike when the erase voltage Vee is applied. In this case, however, after an erase operation is ended, electrons in the gate insulating film 46 are ejected from the substrate 45 (WEL if it is provided) to the floating gate 42 due to its internal electric field. Consequently, the threshold voltage in each memory cell is increased. The margin between the threshold voltage of the memory cell from which data is erased and the program level is thus increased, and, as a result, it is possible to avoid the problem of the degradation of data retention characteristics.

In addition, in the case of a memory cell in which a current flows more easily than in other memory cells, it is expected that electrons are ejected from the floating gate 42 when the opposite polarity high voltage Vrr is applied to the gate 42. However, this problem can be avoided by setting the opposite polarity high voltage Vrr to a proper value. On the contrary, such an application of the voltage Vrr causes an effect that the variation of the characteristics among memory cells is reduced. The reason that this occurs will be described below.

Figure 3A:
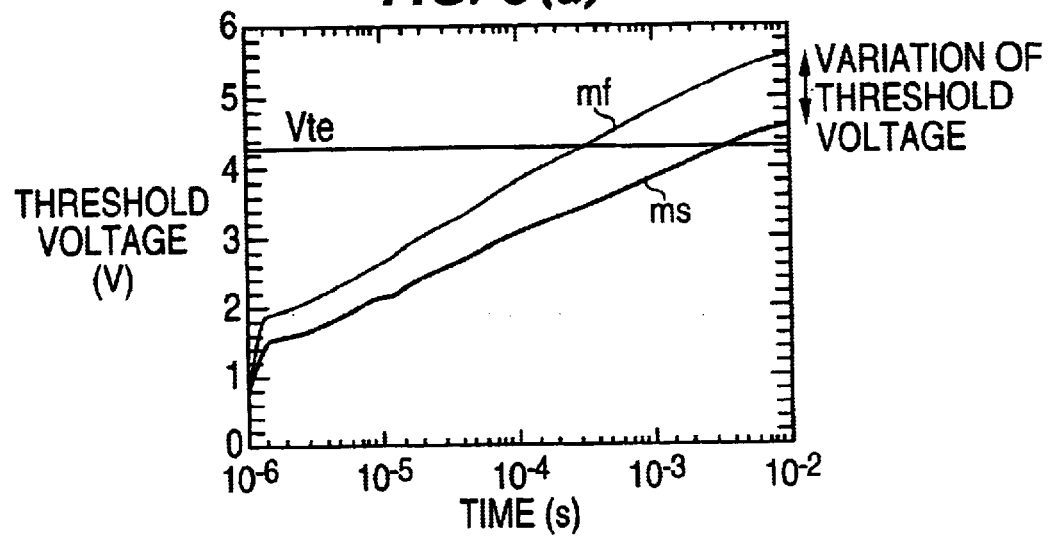
FIGS. 3(a) and (b) are characteristics diagrams of the related art operation method and the present invention's operation method with respect to the erase operation characteristics of the fastest bit and the slowest bit during an erase operation from a plurality of memory cells connected to a common word line.
Figure 3B:
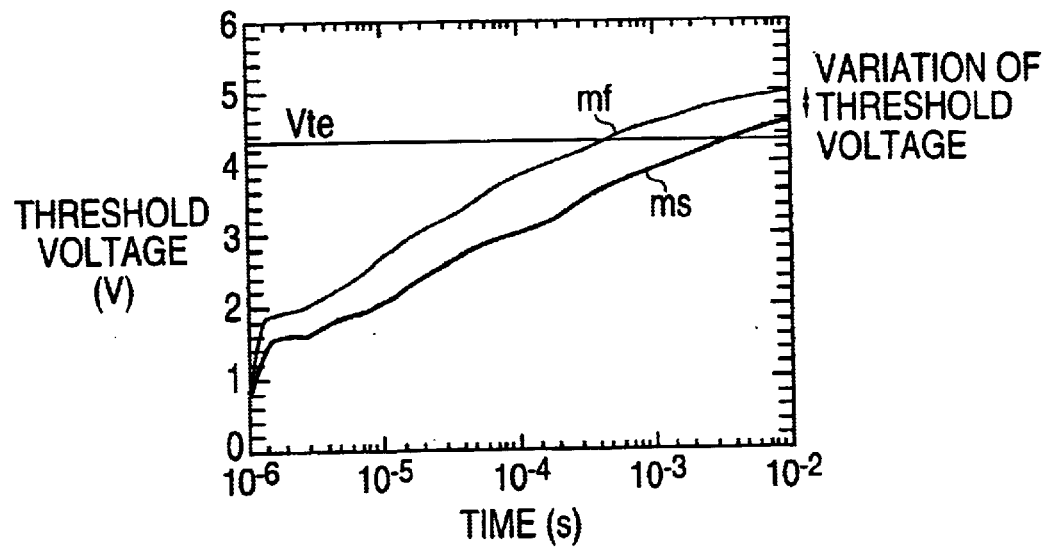

FIG. 3(a) shows time series changes of the threshold voltage of each of a plurality of memory-cells 12 connected to a common word line Wn, which is caused by an erase operation in which the second operation voltage Vrr is not applied. FIG. 3(b) shows time series changes of the threshold voltage of each of those memory cells 12 caused by the erase operation of the present invention, in which the second operation voltage Vrr is applied. Generally, the threshold voltages of the memory cells are distributed at any time due to a variation of characteristics among the memory cells. FIG. 3 indicates the characteristics of the memory cell mf in which data is erased most quickly among the memory cells 12, and the characteristics of the memory cell ms from which data is erased last among the memory cells 12. In this case, if the same voltage is applied to those memory cells 12, the F-N tunnel current flows more easily in the memory cell mf than in other memory cells. The threshold voltage of the memory cell mf is still first to reach a desired erase threshold voltage Vte. On the contrary, if the same voltage is applied to those memory cells 12, the F-N tunnel current flows less easily in the memory cell ms than in other memory cells. As a result, the threshold voltage of the memory cell ms thus takes a longer time than other memory cells to reach a desired erase threshold voltage Vte.

If the conventional erase operation shown in FIG. 3(a) is executed, the erasing time is decided by the memory cell ms that has the longest erasing time, and thereby the threshold voltage, after the erase operation is ended, is varied as described above.

In the case of the erase operation of the present invention, after the erase voltage Vee is applied, the second operation voltage Vrr is applied, and, as a result, the electric field is applied to the gate insulating film of the object memory cell. The polarity of the electric field is opposite to that of the applied erase voltage. In the initial stage of this erase operation, each memory cell has a low threshold voltage, so the memory cell is affected to a lesser extent by the electric field applied to the gate insulating film when the second voltage Vrr is applied. Consequently, the threshold voltage of the memory cell is varied as in the related art examples. However, along with the progress of the erase operation, the threshold voltage of the memory cell and the opposite polarity electric field are increased with the application of the second voltage Vrr. Therefore, oppositely from the application of the erase voltage in the initial stage, electron are ejected from the floating gate 42.

Since the memory cell ms having the longest erasing time has a threshold voltage lower than those of other memory cells that are subject to the same erase operation the opposite polarity electric field which is applied to the gate insulating film 46 of the memory cell ms is comparatively low. In addition, since the F-N tunnel current flows less easily in this memory cell ms than in other memory cells, almost no electrons are ejected from the floating gate 42. However, the electrons trapped in the gate insulating film 46, unlike the electrons in the floating gate, are ejected easily even when the opposite polarity electric field is comparatively small. Consequently, in the memory cell ms having the longest erasing time, the electrons trapped in the gate insulating film 46 can be ejected without wasting the electrons injected into the floating gate 42 when the erase voltage Vee is applied.

On the other hand, since the threshold voltage in the memory cell mf having the shortest erasing time is high, the opposite polarity electric field which is applied to the gate insulating film 46 is comparatively high. In addition, since the F-N tunnel current flows in this memory cell mf more easily than in other memory cells, electrons are ejected from the gate oxide film 46 and the floating gate 42 to the substrate 45 (or WEL) when an electric field with a polarity opposite to that of the erase voltage is applied. Along with the progress of the erase operation, data is programmed/erased in/from the memory cell mf with the application of the second operation voltage Vrr. The variation of the threshold voltage is thereby suppressed more effectively than in the related art as shown in FIG. 3(b).

Figure 1B:
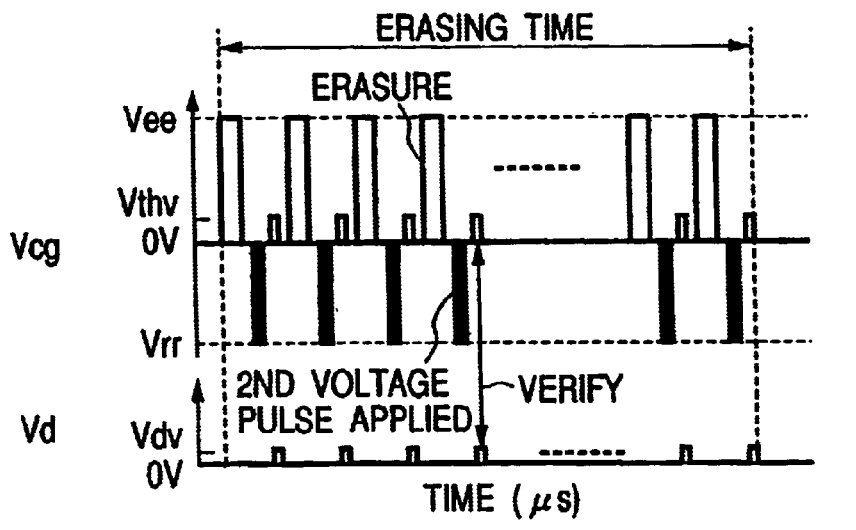
Figure 7A:
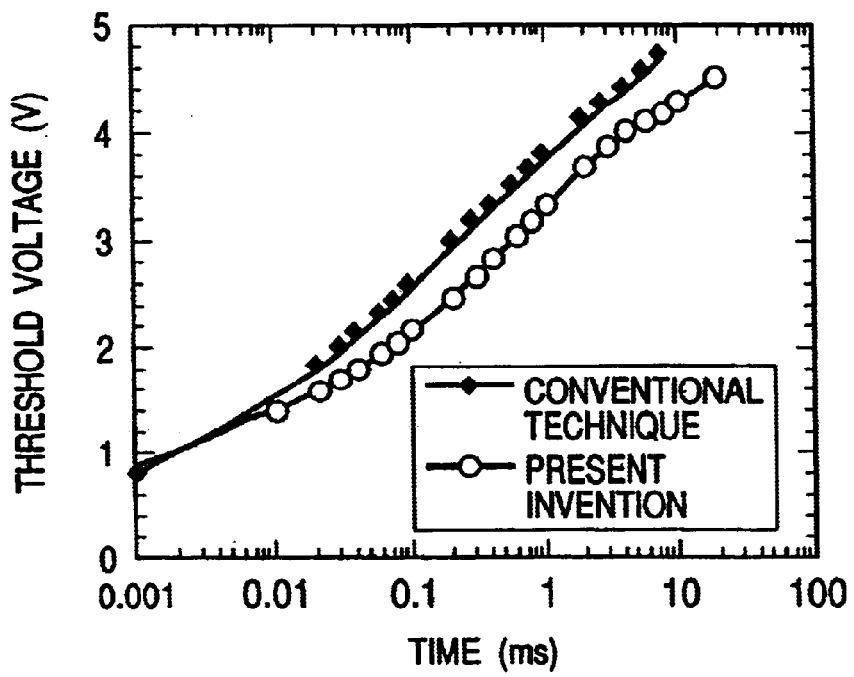
FIG. 7(a) is a characteristics diagram for comparing the erasing time between both methods.
Figure 7B:
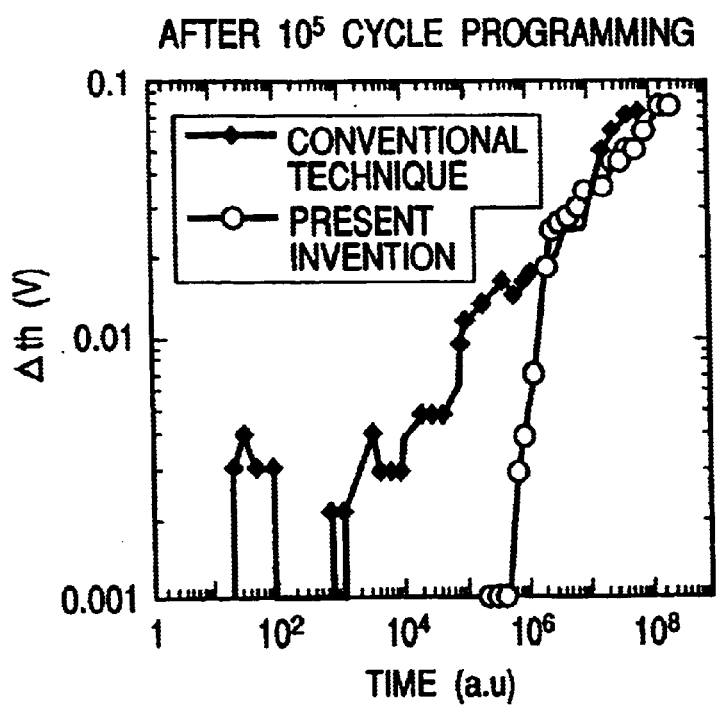
FIG. 7(b) is a characteristics diagram for comparing the electron retention characteristics between both methods after an erase operation is finished.

FIG. 7(a) shows the result of a comparison between the erase operation method in this embodiment and the related art erase operation method. The erase operation in this method includes step S11 for applying the second operation voltage Vrr, which is a voltage pulse for ejecting electrons trapped in an insulating film. The related art method does not apply this second operation voltage Vrr. FIG. 7(b) shows the result of a comparison of the electron retention characteristics between those two methods after an erase operation is ended. In this case, as shown in FIG. 1(b), the voltage Vee of the first operation voltage pulse is set to 18V and the pulse width t11 of the first operation voltage pulse is set to 10 $\mu$s. The voltage Vrr of the second voltage pulse is set to −14V and the pulse width t21 of the second voltage pulse is set to 5 $\mu$s. The $\Delta$Vth in FIG. 7(b) indicates a variation level of the threshold voltage from the threshold value at the end of an erase operation. With this variation in FIG. 7(b), it will be understood that the erase operation method in this embodiment can improve the initial electron retention characteristics, especially after an erase operation is ended more than the related art erase operation method. This is because, the variation of the threshold voltage caused by the leakage of the electrons trapped in the gate insulating film is suppressed effectively. The variation level $\Delta$vth of the threshold voltage, when left for a long time after the erase operation, depends on the leakage of the electrons stored in the floating gate 42, so the difference of the characteristics between those two methods is narrowed. And, accordingly, the result shown in FIG. 7(a) is that the erasing time is increased with the application of the second operation voltage Vrr in the case of the operation method of the present invention. However, this erasing time can be reduced by more than an over-head time of 1 to 20 ms needed for the stress application in the second related art example, described in the related art technology, by setting the pulse width t21 the second voltage pulse Vrr shorter than the pulse width 11 of the first operation voltage pulse.

As described above, if the operation method of this embodiment is applied for a nonvolatile semiconductor memory device, electrons trapped in the gate insulating film 46 are ejected before the threshold voltage is verified after the application of the erase voltage Vee. Consequently, it is possible after a verify operation to suppress the variation of the threshold voltage caused by the leakage of the trapped electrons. The electron retention characteristics when left after an erase operation, as well as the disturb characteristics when a program disturb is received, are thus improved more than those of the related art. In the above description, it is assumed that the erase operation is performed only for word lines, but the erase operation unit may also be varied freely.

Although the description of this embodiment is focused on erase operations, the present invention is not limited only to such erase operations; it is also effective for program operations as described above. In other words, a program operation can be performed in accordance with steps S20 to S23 in the flow chart shown in FIG. 9.

In this embodiment, electrons are injected into the floating gate of each of the memory cells connected in parallel, as shown in FIG. 6, from the entire surface of the transistor channel using the F-N tunnel phenomenon. However, the methods for disposing memory cells and for injecting/ejecting electrons for realizing the operation method of this invention are not limited only to those described above.

Hereunder, another embodiment of the present invention for various methods for injecting/ejecting electrons will be described. Each operation voltage is set, assuming that the thickness of the gate oxide film of each memory cell is about 10 nm and the capacitive coupling ratio between the control gate. 41 and the floating gate 42 is about 0.6. However, each voltage value may be varied freely.

<Second Embodiment>

As in the first embodiment, in this embodiment, the operation method of the present invention is applied for injecting electrons into the floating gate from the entire surface of the transistor channel using the F-N tunnel phenomenon in each of the memory cells connected in parallel as shown in FIG. 6. The structure of each memory cell in this embodiment is the same as the memory cell shown in FIG. 4(b). Thus, the same reference numerals are used for the same items as those shown in FIG. 4(b), in order to avoid redundant description. In this embodiment, an erase operation is defined as an operation for injecting electrons into the floating gate of a memory cell in order to raise the threshold voltage thereof.

Figure 15A:
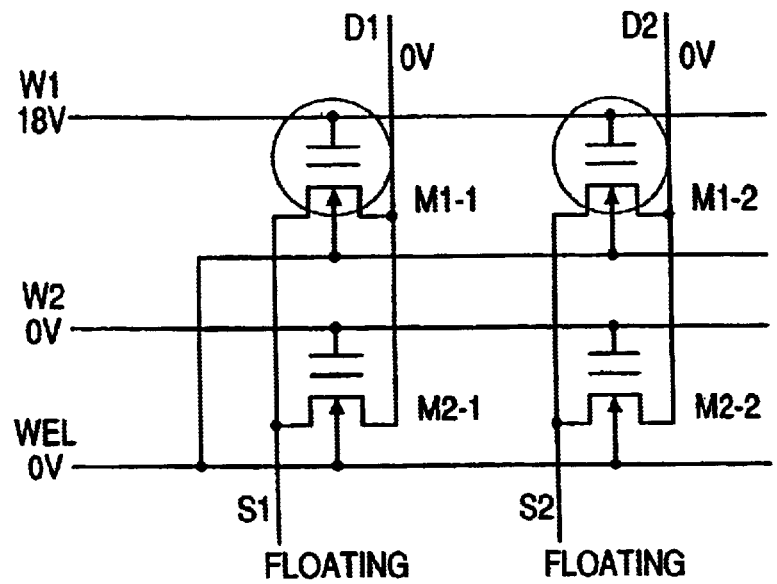
FIG. 15(a) is an explanatory view of an equivalent circuit indicating a configuration of a memory array and FIG. 15(b) is a timing flow of applied voltages during an erase operation.
Figure 15B:
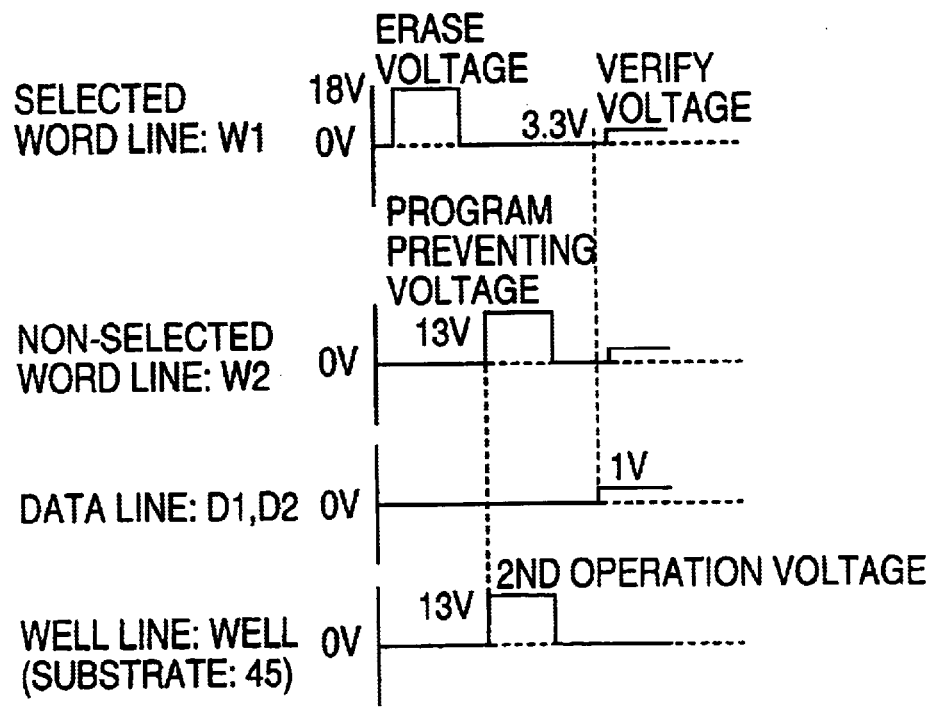

FIG. 15(a) is an explanatory view of the equivalent circuit of the memory cell array in this embodiment, and FIG. 15(b) is a timing flow chart of applied voltages in this embodiment. In this Embodiment, electrons are injected as follows. At first, a positive high voltage 18V is applied to a selected word line (e.g., the word line W1 in FIG. 15(a)) as an erase voltage as shown in FIG. 15(a) and 15(b), which is the first operation voltage. Accordingly, the ground potential is set to the well line WEL (substrate 45 if no well is provided) and the data line D1 and D2 in order to inject electrons into the floating gate 42. At this time, the around potential is set to the non-selected word line W2 in order to prevent electron injection. After this, the selected word line W1 is set to the ground potential and a positive voltage 13V is applied to the well line WEL (or the substrate 45) as the second operation voltage. When the second operation voltage is applied, the gate insulating film 46 is applied an electric field with a polarity opposite to that of the electric field given with the application of the first operation voltage. Thus, electrons trapped in the gate insulating film 46 can be ejected. The second operation voltage is also applied to the well line WEL (or the substrate 45) in this embodiment. Therefore, if the non-selected word line W2 is kept set at the ground potential when the second operation voltage is applied, the threshold voltage in both of the memory cells M2-1 and M2-2 connected to the non-selected word line W2 might be varied due to a disturb phenomenon. Therefore, in order to suppress the variation of the threshold due to such a disturb phenomenon, a positive voltage, approximately equal to the second operation voltage, must be applied beforehand to the non-selected word line W2 as a program preventing voltage. After this, a verify voltage 3.3V is applied to selected word line W1, and 1V is applied to data line D1 and D2.

In this embodiment, no negative voltage is not needed as an operation voltage. Consequently, the peripheral circuits can be simplified in structure by using the operation method that do not need negative voltage, even for program operations.

<Third Embodiment>

Figure 16A:
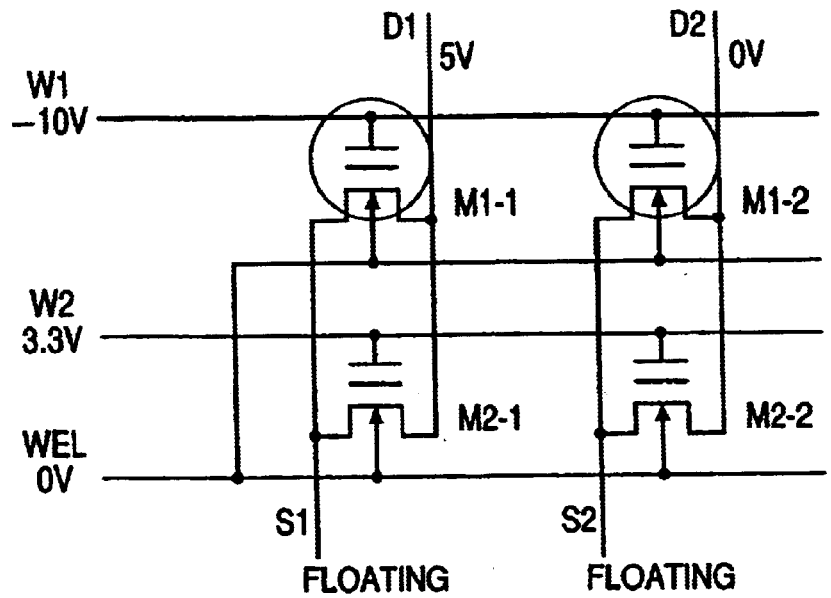
FIG. 16(a) is an explanatory view of an equivalent circuit indicating a configuration of memory array and FIG. 16(b) is a timing flow of applied voltages during a program erase operation.
Figure 16B:
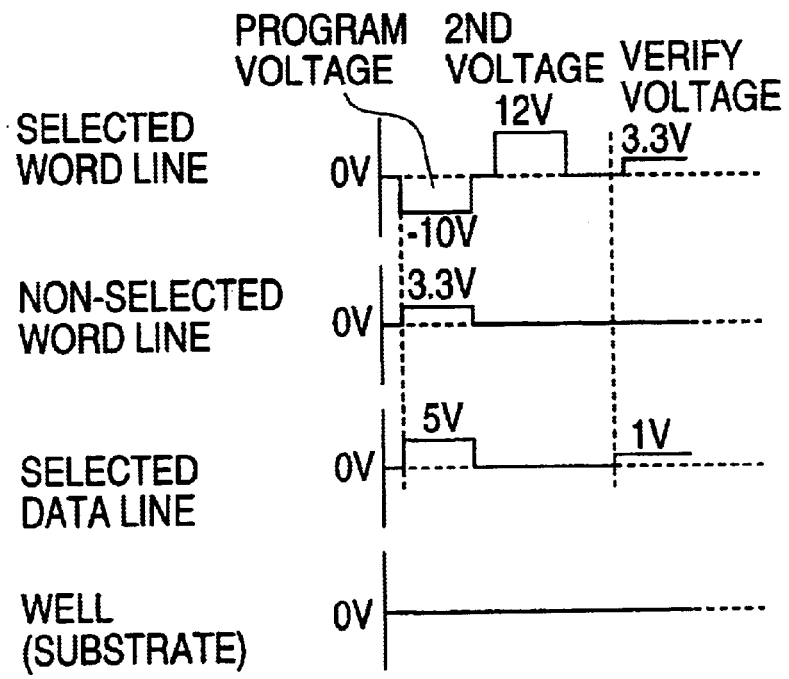

In this embodiment, the program operation method of the present invention for memory cells connected in parallel as shown in FIG. 6 will be described. The structure of the memory cells in this embodiment is the same as that shown in FIG. 4(b), so the same reference numerals will be used for the same items as those in FIG. 4(b), in order to avoid redundant description. This is also true for the embodiments to be described later. In this embodiment, a program operation is defined as an operation for electing electrons from the floating gate 42 to the drain diffusion layer of each transistor using the F-N tunnel phenomenon. However, those electrons may also be ejected to the source diffusion layer. FIG. 16(a) shows an explanatory view of an equivalent circuit of the memory cell array in this embodiment, and FIG. 16(b) shows a timing flow for applied voltages in this embodiment.

In this embodiment, electrons are ejected as follows. At first, a negative high voltage −10V is applied to the selected word line W1 connected to a desired memory cell (M1-1 in this case) for which a program operation is performed as shown in FIGS. 16(a) and FIG. 16(b). The negative high voltage 15 10V is a program voltage, which is assumed to be the first operation voltage. At the same time, a positive voltage 5V is applied to the selected data line D1 in order to eject electrons from the floating gate 42 to the drain diffusion layer 44 using the F-N tunnel phenomenon. (FIG. 9. S20) At this time, a positive voltage, for example, the power supply voltage Vcc (=3.3V), is applied to the non-selected word line W2 connected to the control gate of the non-selected memory cell M2-1 sharing data lines with the selected memory cell M1-1 in order to suppress the variation of the threshold voltage that is caused by a disturb phenomenon from a data line.

Figure 9:
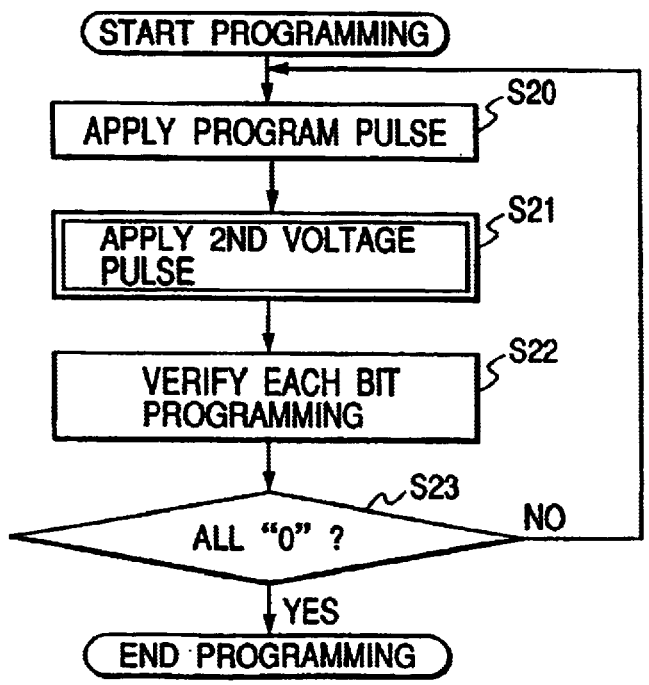
FIG. 9 is a flow chart of a program operation in another embodiment of the operation method for the nonvolatile semiconductor memory device of the present invention.

After this, a positive voltage 12V is applied to the selected word line W1 as the second operation voltage, and the well line WEL (or the substrate) and the data line D2, and the non-selected word line W2 are set to the ground potential respectively. When the second operation voltage is applied in such a ay, the gate insulating film 46 of the selected memory cell M1-1 is applied to an electric field with a polarity opposite, to that of the electric field given with the application of the first operation voltage. The electrons trapped in the gate insulating film 46 can thus be ejected. (FIG. 9, S21)

The program operation for the selected memory cell M1-1 is verified by applying a positive voltage 3.3V to the word line W1, and a positive voltage 1V to the selected data line D1 in order to set non-selected word lines and the well line WEL to the ground potential. At this time, if the selected memory cell M1-1 is off, it means that the program operation is not completed. Therefore, the program operation is performed again. If the memory cell M1-1 is on, the program operation for this memory cell is ended. (FIG. 9. S22, S23)

Since the well line WEL (the substrate if no well line is provided) can be fixed to the ground potential in the operation flow in this embodiment, the program operation can be executed faster than in the method in which the potential of the well line WEL (or the substrate) is changed.

The operation methods described above in the first to third embodiments can also apply to the AND type flash memory, described in "International Electron Devices Meeting (pp. 991–993, 1992)". In addition, the voltage application flow shown in FIGS. 1(b), 15(b), and 16(b) can apply to the DINOR type flash memory described in "International Electron Devices Meeting (pp. 599–602, 1992). The reasons for this is that the voltage applied to a selected memory cell in program and erase operations can be considered to be the same as that for the AND type flash memory, although the disposition of the memory cells differ from that of the AND type flash memory.

<Fourth Embodiment>

In this embodiment, the application of the operation method of the present invention, applied to a program operation for memory cells connected serially will be described. In this embodiment, a program operation is defined as an operation for injecting electrons from the entire surface of the transistor channel into the floating gate 42 of each memory cell using the F-N tunnel phenomenon. However, the definition of the program operation is not limited only to this.

Figure 17A:
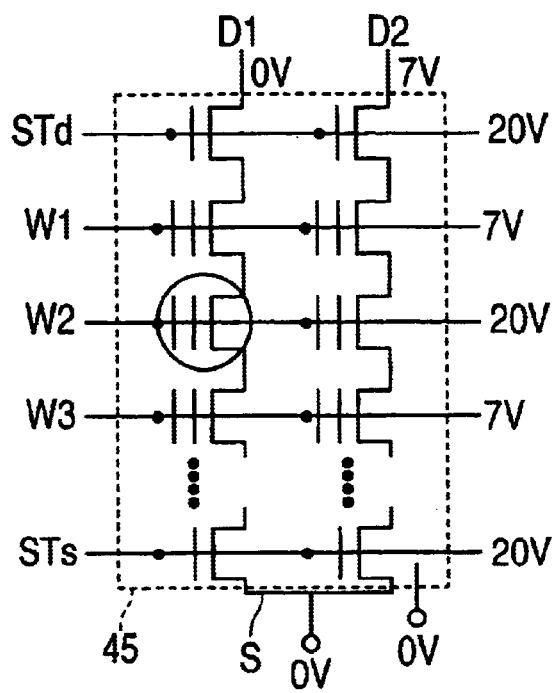
FIG. 17(a) is an explanatory view of an equivalent circuit indicating a configuration of a memory array.
Figure 17B:
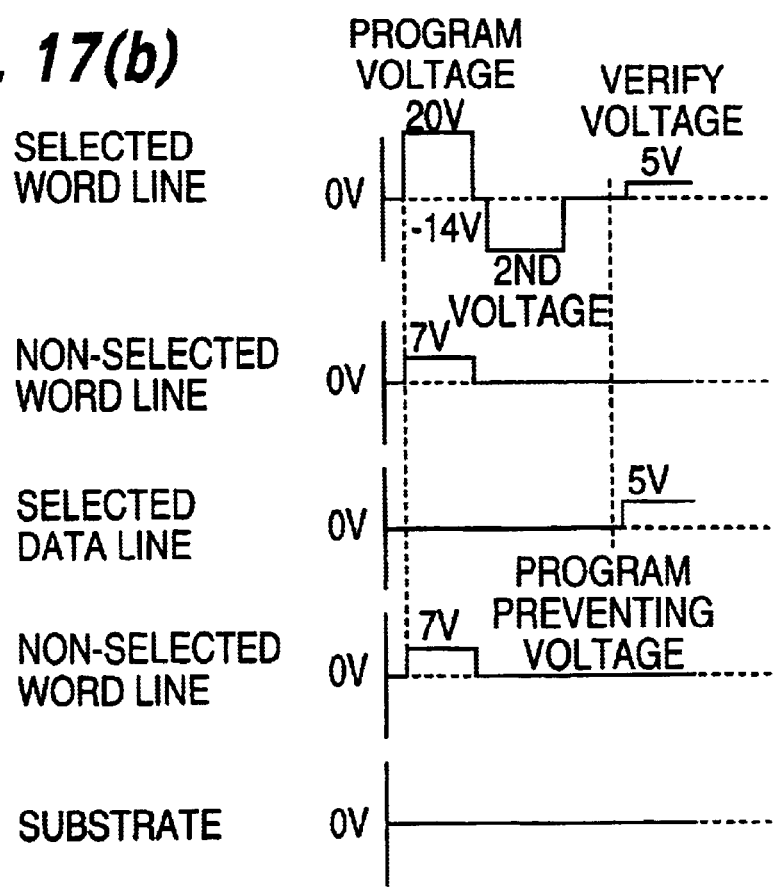
FIG. 17(b) is a timing flow of applied voltages during a program operation.

FIG. 17(a) shows an explanatory view of an equivalent circuit of the memory cell array composed of a plurality of memory cells connected serially, and FIG. 17(b) shows a timing flow of applied voltages in this embodiment. In FIG. 17(a), STd and STs are control signal lines for turning on/off transistors provided at both sides of each block of memory cells connected serially, and are used to select the memory cell block. In this case, while a positive voltage 20V is applied to the control line STd or STs, the select transistor is assumed to be on.

In this embodiment, it is assumed in the following description that one (enclosed in a circle) of the memory cells connected to, for example, the word line W2 is selected. As shown in FIG. 17(a) and FIG. 17(b), at first, a positive high voltage 20V is applied to the selected word line W2 as a program voltage, which is the first operation voltage. Then, the substrate 45 (WEL if a well is provided) is set to the ground potential. In addition, the selected data line D1 connected to the selected memory cell and common source line S are set to the ground potential, and 7V is applied to non-selected data lines. D2 (FIG. 9, S20) Since a high electric field is applied to the gate insulating film 46, due to the high voltage 20V of the word line W2 and the ground potential 0V of the transistor channel in the selected memory cell, electrons are injected in the floating gate 42. No program operation is executed in non-selected memory cells, however, since they are applied with a program inhibit voltage 7V.

After this, a negative voltage −14V is applied to the selected word line W2 as the second operation voltage. Other word lines are set to the ground potential. With this second operation voltage applied to the gate insulating film 46, the electric field has a polarity opposite to that of the electric field given with the application of the first operation voltage. The electrons trapped in the gate insulating film 46 can thus be ejected. (FIG. 9, S21)

A program operation can be verified by applying a positive voltage 5V to the selected word line W2 and the selected data line D, respectively. (FIG. 9, S22, S23)

The operation flow in this embodiment enables faster program operations than that of the related art method that changes the potential of the substrate, since the substrate (or well) can be fixed at the ground potential.

<Fifth Embodiment>

In this embodiment, an erase operation performed for memory cells connected serially using the operation method of the present invention will be described. In this embodiment, an erase operation is defined as an operation for ejecting electrons from the floating gate 42 to the entire surface of the transistor channel using the F-N tunnel phenomenon, as in the first related art example. The definition of the erase operation is not limited only to this, of course.

Figure 18A:
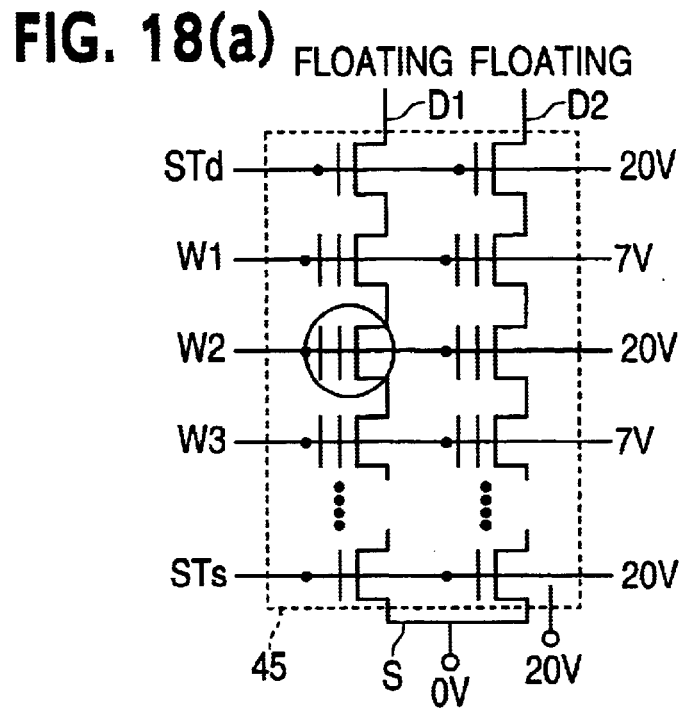
FIG. 18(a) is an explanatory view of an equivalent circuit indicating a configuration of a memory array.
Figure 18B:
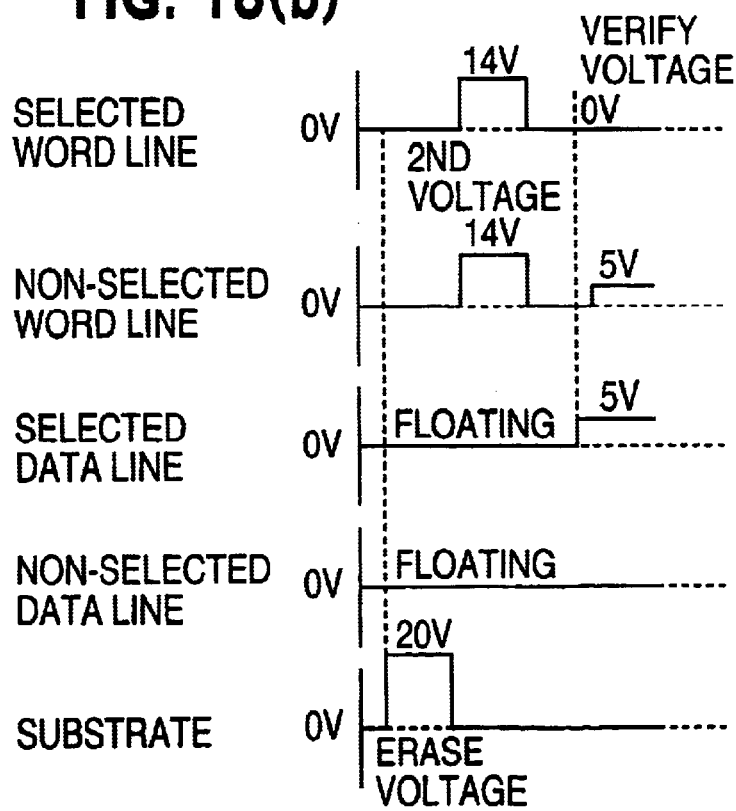
FIG. 18(b) is a timing flow of applied voltages during an erase operation.

FIG. 18(a) shows an explanatory view of an equivalent circuit of the memory cell array, and FIG. 18(b) shows a timing flow of the voltages applied in this embodiment. In this embodiment, an erase operation is executed as follows. At first, a positive high voltage 20V is applied to the substrate 45 (the well if it is provided) as the first operation voltage, which is an erase voltage, in order to eject electrons from the floating gate 42 to the substrate 45 (or the well) of each of a plurality of memory cells. At this time, common source line is set:to the ground potential and the data lines D1 and D2 are set to the floating state.

After this, a positive voltage 14V is applied to the word lines W1, W2, W3, . . . as the second operation voltage, in order to make the polarity of the electric field given to the gate insulating film 46 opposite to that of the electric field given with the application of the first operation voltage. The electrons trapped in the gate insulating film 46 can thus be ejected. At this time, the data lines D1 and D2 are set to the ground potential, respectively.

Such an erase operation can be verified by setting the selected word line W2 and the substrate 45 (or the well) to the ground potential and applying a positive voltage 5V to the non-selected word lines W1, W3, . . . , as well as to the selected data line D1, respectively.

The operation methods in this embodiment and in the fourth embodiment described above can also apply to, for example, NAND type flash memories.

Figure 19A:
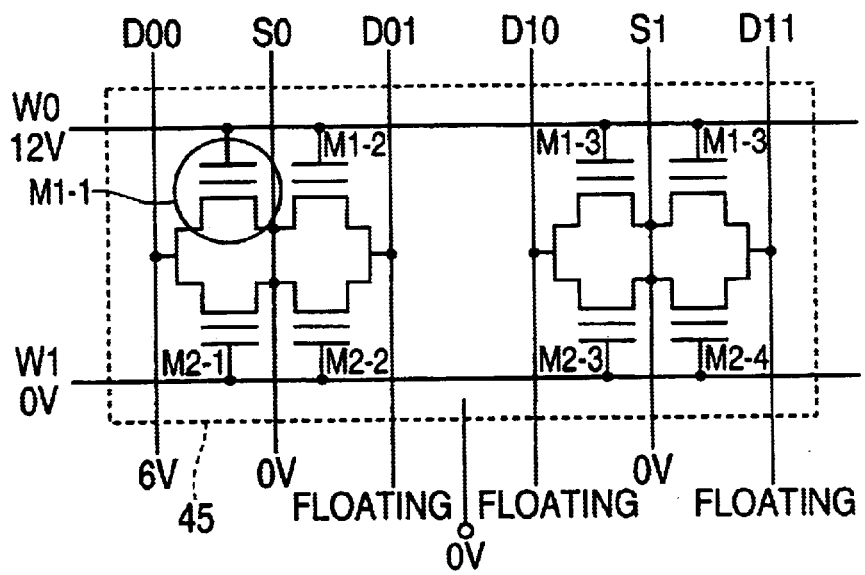
FIG. 19(a) is an explanatory view of an equivalent circuit indicating a configuration of a memory cell array.
Figure 19B:
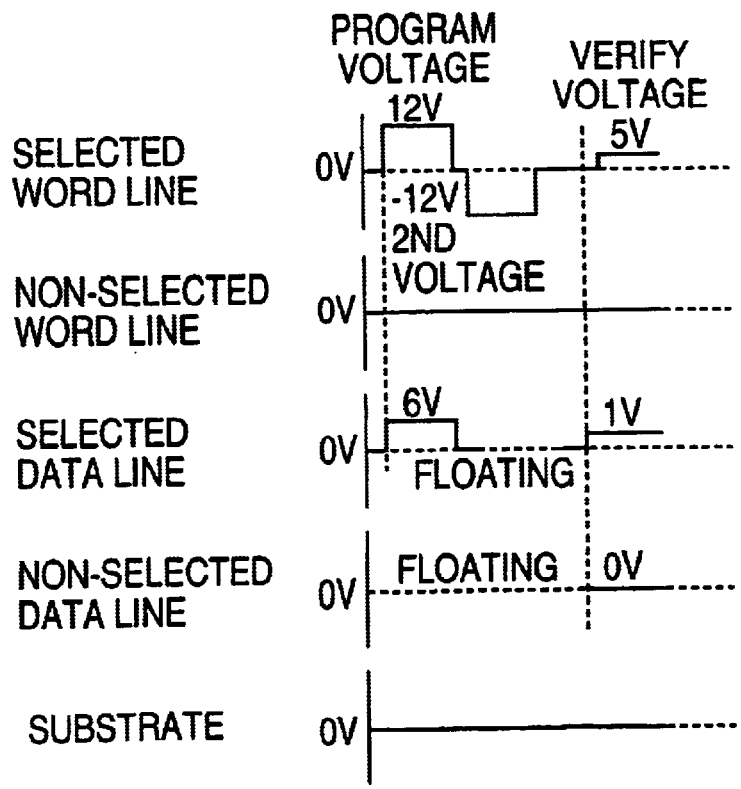
FIG. 19(b) is a timing flow of applied voltages during a program operation.

Furthermore, the operation method of this invention, which takes the same operation flow as those described above can also apply to NOR type flash memories and other stack gate type nonvolatile semiconductor memory devices. FIG. 19(a) and FIG. 19(b) show an NOR type flash memory obtained by applying the operation method of the present invention. FIG. 19(a) shows an explanatory view of an equivalent circuit of the memory cell array of the NOR type flash memory, and FIG. 19(b) shows a timing flow of applied voltages using the operation method of the present invention. In FIG. 19(a), W0 is a selected word line and D00 is a selected data line. For a program operation, 12V is applied to the selected word line W0, and 6V is applied to the selected data line D00. At this time, non-selected word lines and the substrate 45 (the well if it is provided) are set to the ground potential. Non-selected data lines are set to the floating state. In a selected memory cell M1-1 (enclosed in a circle in FIG. 19(a)) electrons are injected into the floating gate through the hot electron phenomenon. After the program operation, −12V is applied to the selected word line W0 as the second operation voltage, and the selected data line D00 is set in the floating state. At this time, non-selected word lines and the substrate are set to the ground potential, and non-selected data lines are kept in the floating state. Then, 1V is applied to the selected data line D00, and a verify voltage 5V is applied to the selected word line W0 to verify the program operation. At this time, non-selected word lines, non-selected data lines, and the substrate are set to the ground potential, respectively. Each program operation can thus be executed as described in this embodiment.

The erase operation method of the present invention is intended to improve the data retention characteristics by preventing electrons from being trapped in an insulating film. The method is different from the related art methods that suppress the variation of the threshold voltage through program/erase cycles using the self-focusing principle respectively, for example, described in "1991 International Electron Devices Meeting 11.4 (pp. 307–310)". In other words, the erase operation of the present invention controls the distribution of electrons in an object insulating film by applying a voltage with a polarity opposite to that of the operation voltage, regardless of the operation type (program or erase), before a verify operation thereby to suppress the variation of the threshold voltage caused by a leakage of trapped electrons. Consequently, unlike the related art program/erase operations that use the self-focusing principle, the operation method of the present invention can also apply to any nonvolatile semiconductor memory device in which an area other than the transistor channel is used for passing electrons through an insulating film area during a program or erase operation. The method can apply, for example, to an EEPROM with an erase gate described in "1984 International Electron Devices Meeting 17.3 (pp. 464–465)".

Furthermore, the operation method of the present invention can reduce the variability of the characteristics of a plurality of memory cells, as described in the first embodiment.

The operation method of the present invention can also make the pulse width t21 shorter than the pulse width t11 by selecting a proper value for the second operation voltage Vrr, as well as reduce the overhead of the erasing time by more than the first and second related art examples, in which a voltage pulse is applied with a width of about 100 ms to 1 s.

<Sixth Embodiment>

Figure 8:
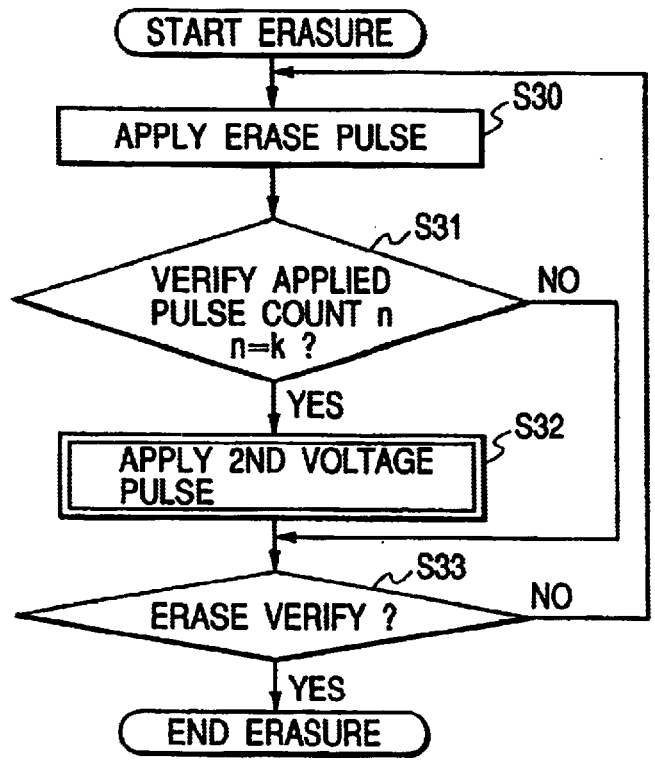
FIG. 8 is a flow chart of an erase operation in another embodiment of the operation method for the nonvolatile semiconductor memory device of the present invention.

FIG. 8 shows a flow chart of an erase operation which explains another embodiment of how to operate the nonvolatile semiconductor memory device of the present invention. The circuit configuration of the nonvolatile semiconductor memory device in this embodiment is the same as those shown in FIGS. 2 and in the first embodiment, so the illustration is omitted. This circuit includes a memory cell array 10, a control circuit 20, and a power supply control circuit 30, as in the first embodiment. The control circuit 20 includes a counter 24 for recording the output count of a predetermined voltage from the program/erase voltage generating circuit 32, as well as a power supply switching circuit 22, a program/erase deciding circuit 23, and a command decoder 21.

Hereunder, an erase operation for the nonvolatile semiconductor memory device in this embodiment will be described, with reference to FIGS. 8 and 20.

At first, the switch SW1 is closed for the word line Wn selected by the row decoder 18, according to a signal from the power supply switching circuit 22 in step S30, and thereby the word line Wn is connected to the erase voltage generating circuit 32a. Then, an erase voltage Vee, which is the first operation voltage, is applied to the word line Wn as a pulse voltage with a pulse width of t11. At the same time, the counter 24 records "1" as the voltage application count n. At this time, the threshold voltage is raised in each of a plurality of memory cells 12 sharing the word line Wn, as in the first embodiment. The switches SW2 to SW4 are kept open during this time. In order to reduce the erasing time in this operation, a short pulse width is set, allowing data in some memory cells to remain as it is (not erased), since the erasing time becomes longer if the pulse width t11 of the erase voltage Vee is given enough of a margin to make the threshold voltage of every memory cell reach a predetermined erase level, and the erase operation is repeated. Since t11 is set to a pulse width so that such an erase operation is executed at least twice, the controlling accuracy of the threshold voltage can be improved.

After this, the pulse application count n is verified in step S31. Specifically, the value n stored in the counter 24 is referenced. If the value is not k, control goes to step S33, where the erase operation is verified. In this embodiment, if k=4 is assumed, it is determined whether or not the count n is 4. Since it is now n=1, control goes to step S33. Operations of step S33 may be performed by the program/erase deciding circuit 23. That is, the program/erase deciding circuit 23 may decide "YES" or "NO" in step S33. In order to verify the threshold voltage of each of the memory cells 12 connected to the word line Wn, a switch (not shown) is closed, according to a signal from the power supply switching circuit 22, in order to connect the verify voltage generating circuit and set the word line Wn and other data and source lines to a predetermined potential, respectively in step S33. Then, the output of the object data line is amplified in the sense amplifier/data latch circuit 14 and compared with a reference value. If any memory cell whose threshold voltage does not reach a predetermined erase level in the verification is found, control goes back to step S30 for a process of re-applying the erase voltage Vee. The same subsequent operations are then repeated 3 times.

After the erase voltage Vee is applied in step S31, if the value in the counter 24 is 4, that is, if it is the fourth erase operation, the value in the counter 24 is reset and control goes onto the next step S32.

The switch SW2 is closed, according to a signal from the power supply switching circuit 22, in order to connect the word line Wn to the second operation voltage generating circuit 34a in step S32, and then the word line Wn is applied the second operation voltage with a polarity opposite to that of the erase voltage Vee. The pulse width t21 is shorter than the pulse width t11. With this application of the second operation voltage Vrr, a negative electric field is applied to the gate insulating film 46 of each of the memory cells 12 connected to the word line Wn. The electrons trapped in the gate insulating film 46 can thus be ejected. The switches Sw1, SW3, and SW4 are kept open during this time.

After this, in order to verify the threshold voltage of each of the memory cells 12 connected to the word line Wn in step S33, a switch (not shown) is closed, according to a signal from the power supply switching circuit 22, in order to connect the verify voltage generating circuit 33 to the word line Wn, set the word line Wn, other data and source lines to a predetermined potential, respectively, and amplify the output of an object data line in the sense amplify data latch circuit 14 and compare it with a reference value. If any memory cell whose threshold voltage does not reach a predetermined erase level is found, control goes back to step S30 for applying the erase voltage Vee to the control gate. The voltage Vee is the first operation voltage again. The above operations are repeated until the data is erased completely from every memory cell connected to the word line Wn, and then the erase operation is ended.

In this embodiment, the second operation voltage Vrr is applied only once, while the erase voltage pulse Vee is applied four times to eject electrons trapped in the insulating film. Consequently, the overhead of the erasing time can be prevented from increasing more effectively than in the first embodiment, although the trapped electron ejection effect is lowered by a small amount. In addition, the application frequency of the second operation voltage Vrr is not limited only to 4 times; it may be set appropriately to the variability of the device characteristics in the manufacturing process. In addition, it is not necessary to fix the pulse width and the peak value of each of the first and second operation voltages. They may be increased for each predetermined count.

Figure 10:
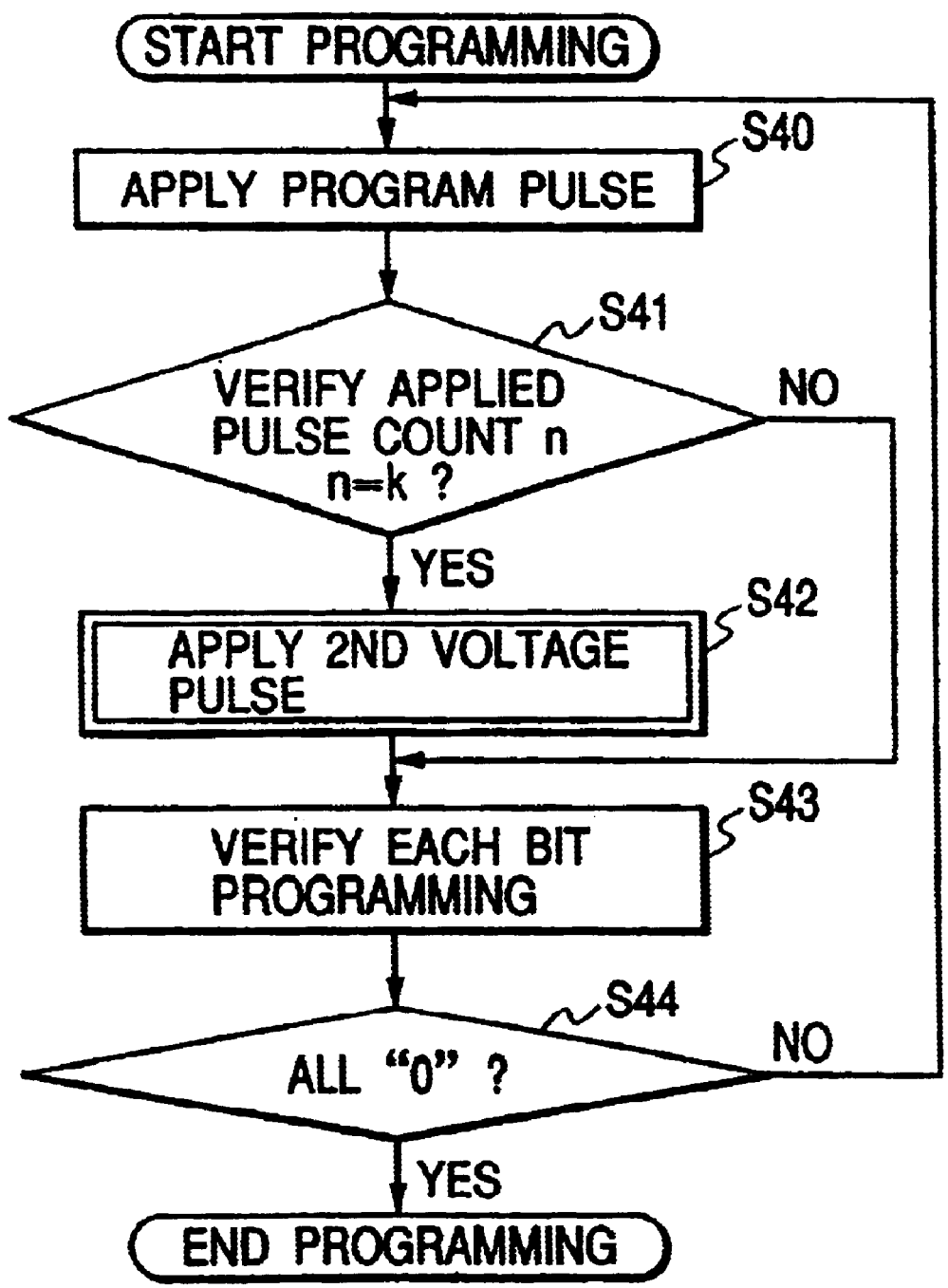
FIG. 10 is a flow chart of an erase operation in yet another embodiment of the operation method for the nonvolatile semiconductor memory device of the present invention.

Although this embodiment has been described for an erase operation, it is also effective for program operations. Especially, if electrons are ejected for a program operation as described in the third embodiment, the threshold voltage range of the program operation is decided by the read voltage and the deplete condition. Consequently, the program operation is executed several times so that the accuracy of the threshold value control will be improved. FIG. 10 shows a flow chart for a program operation in this embodiment. This program operation includes a "all "0" determination" in step S44, which is the only a difference from the erase operation. In step 41, the pulse application count n is verified. Specifically, the value n stored in the counter 24 is referenced. If the valve is not k, control goes to step S43, where the program operation is verified. If the value is k, control goes to step S42, where the second voltage is applied. The program voltage application condition is step S40, the second voltage application condition in step S42 and the verify voltage application condition in step S43 are the same as the condition described in the third embodiment or the fourth embodiment so the description is omitted.

<Seventh Embodiment>

Hereunder, an embodiment of a multi-value flash memory, which allows each memory cell to store data of a plurality of bits, with reference to FIG. 11 will be described. The multi-value flash memory is obtained by applying the nonvolatile semiconductor memory device and its operation method of the present invention.

Figure 11:
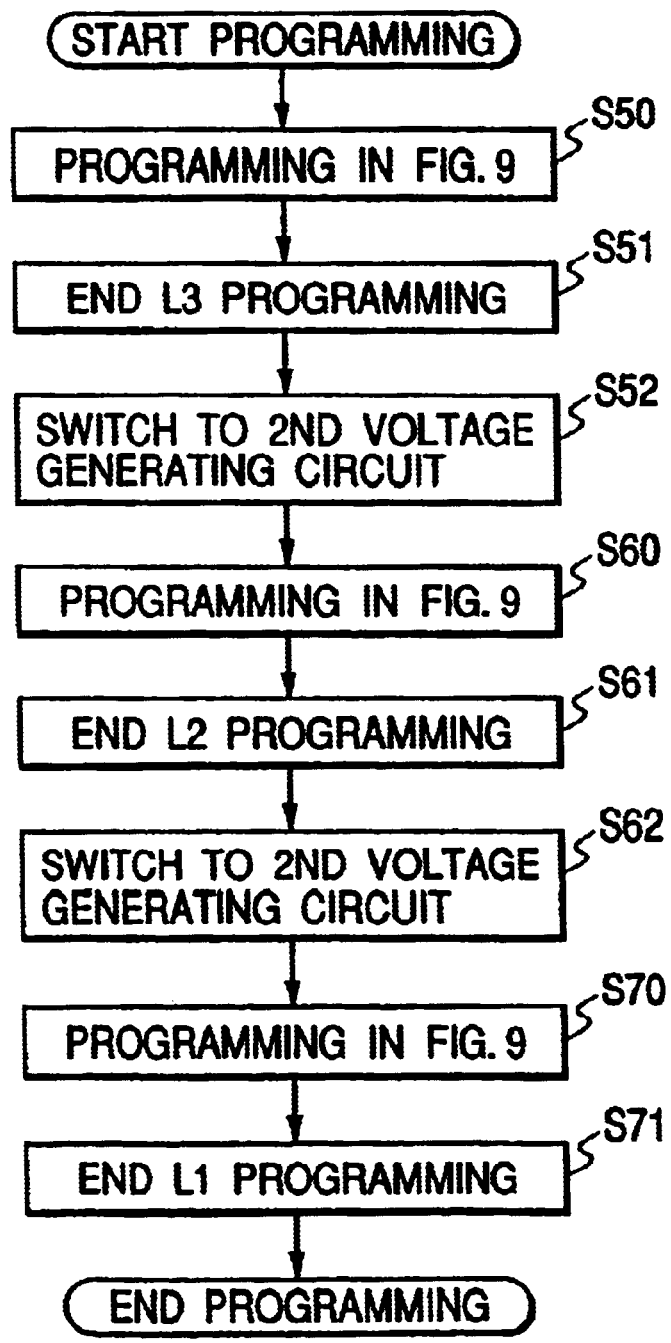
FIG. 11 is a flow chart of an erase operation in still another embodiment of the operation method for the nonvolatile semiconductor memory device of the present invention. It is a flow chart of a program operation in a 4-value flash memory.

FIG. 11 shows a flow chart of a program operation performed for a 4-value flash memory that allows each memory cell to store four values (2 bits). In this embodiment, memory cells are connected in parallel, just like those shown in FIG. 6. The program operation is the same as that described in the third embodiment. In addition, the memory device configuration is the same as that shown in FIG. 2, but a plurality of second voltage generating circuits are used. Hereunder, a program operation for a plurality of memory cells connected to a word line W1 will be described. In the initial status, the threshold voltage of each of the memory cells connected to the word line W1 is assumed to be the erase threshold voltage VthE or higher.

At first, the first program word line voltage Vpp1 is applied to the word line W1 as a program operation voltage in step S50. At the same time, a program voltage Vdd1 is applied to a data line connected to each object memory cell. The threshold voltages of those predetermined memory cells connected to the word line W1 thus fall simultaneously. After this, the second operation voltage is applied to the word line W1 in order to eject electrons trapped in the gate insulating film 46 of each memory cell during the program operation. After the program operation, a verify operation is performed for each of the memory cells sequentially, as in the verification described in FIG. 9. These operations are repeated for programming in the memory cells until each of the memory cells reaches the third program level L3 (threshold voltage: VthL3~VthL2).

Next, for a memory cell in which the third program level L3 should be set in step S51, that is, for a memory cell for which the object program operation is finished, the voltage Vdd1 to be applied to the data line is changed to the program inhibit voltage.

If there is a memory cell in which data is written up to the lower second program level L2 (threshold voltage: VthL2~VthL1) in step S52, the second voltage generating circuit is switched over. Control then goes to step S60. When the second voltage generating circuit is switched over, the program voltage generating circuit will also be switched over so as to generate Vpp2, which is larger than the voltage Vpp1 in absolute value.

In step S60, the program voltage and the second voltage pulse are applied in order to verify the program operation for each bit and all "0" determination as in step S50. Then, operations in steps S20 to S23 shown in FIG. 9, are repeated until the program operation is completed for every predetermined memory cell that should be written up to the second program level L2.

Next, for a memory cell in which the second program level L2 should be set in step S61, that is, for a memory cell for which the object program operation is finished, the voltage to be applied to the data line is changed to the program inhibit voltage.

In step S62, if there is any memory cell in which data is written up to the lower first program level L1 (threshold voltage: Vth1~) after the second program level L2 is applied, the second voltage generating circuit is switched over. Control then goes to step S70. When the second voltage generating circuit is switched over, the program voltage generating circuit will also be switched over so as to generate Vpp3, which is larger than the voltage Vpp2 in absolute value.

Hereafter, the operations in steps S70 to S71 are performed until the application of the first program Level L1 is finished.

Figure 12:
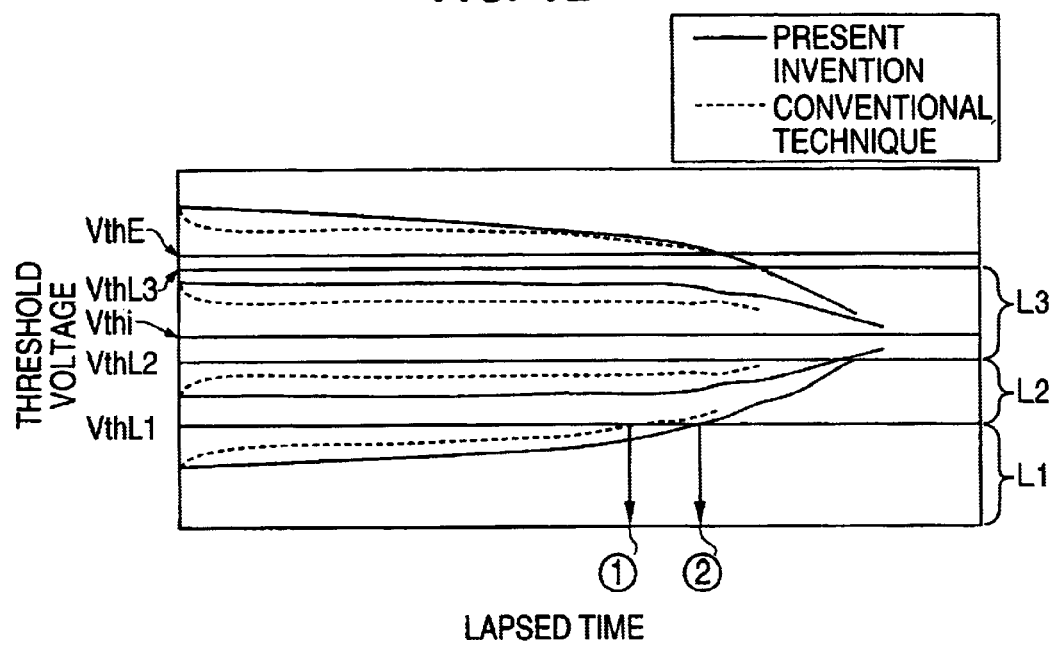
FIG. 12 shows the time series changes of each threshold voltage after a program operation for memory cells using the program operation method of the present invention, shown in FIG. 11, and the related art program operation method.

FIG. 12 is a chart for comparing time series changes of the threshold value (solid line) after a program operation is finished for representative bits in each of a plurality of memory cells set in the program or erase state due to the program operation shown in FIG. 11, with time series changes (dotted line) appearing when a related art program operation is performed. In this chart, Vth1 indicates the threshold voltage of a memory cell when the electrons in the floating gate and the insulating film are in the neutral state. The threshold voltage of each memory cell settles to this threshold voltage Vth1 in time.

As shown clearly in FIG. 12, since the program operation method in this embodiment can suppress leakage of electrons trapped in an insulating film, it is possible to suppress the variation of the threshold voltage of each memory cell more effectively than in the related art method. A longer data retention life can thus be assured (②>①). In addition, since the leakage content of the electrons trapped in the insulating film is ejected, it is possible to suppress the variation of the threshold voltage of each memory cell. Consequently, the margin between program levels can be narrowed more than in the related art method.

<Eighth Embodiment>

As described above, the operation method of the present invention can also apply to any nonvolatile semiconductor memory device provided with memory cells. In each of these memory cells, an insulating film area through which electrons are passing during a program or erase operation is positioned in an area other than the transistor channel.

In this embodiment, it will be described how the operation method of the present invention is applied to an erase operation for a nonvolatile semiconductor memory device composed of memory cells provided with an erase gate, respectively, as in an example described above.

Figure 21A:
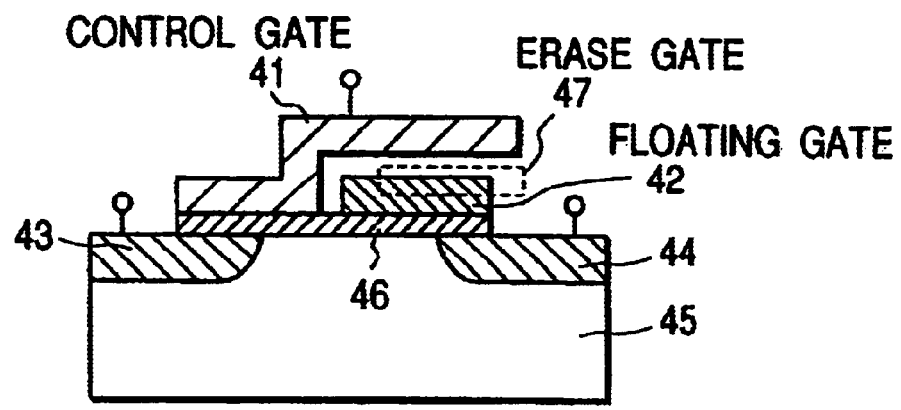
FIG. 21(a) is an explanatory view of a memory cell provided with an erase gate in the source-drain direction.
Figure 21B:
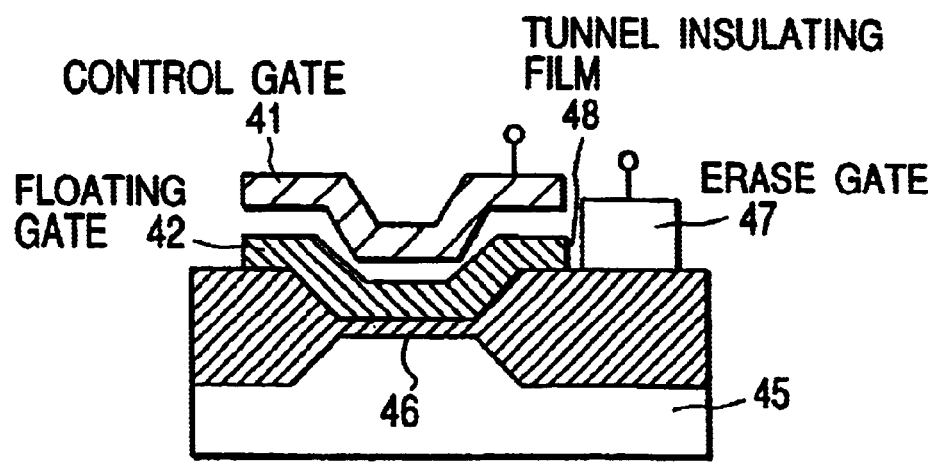
FIG. 21(b) is an explanatory view of the memory cell provided with the erase gate in the vertical direction.

FIGS. 21(a) and (b) show cross sectional views of a memory cell provided with an erase gate in this embodiment. In FIG. 21(a) and FIG. 21(b), the same reference numerals will be used for the same items as those of the memory cell shown in FIG. 4(b), in order to avoid redundant description. In addition to a gate insulating film 46 a control gate 41 and a floating gate 42, each memory cell in this embodiment is provided with an erase gate, which is a third gate electrode. Although FIG. 21(a) does not show the erase gate 47, FIG. 21(b) shows the erase gate with a dotted line so as to be discriminated from the related art example. FIG. 21(b) shows a vertical cross sectional view of the memory cell shown in FIG. 21(a). This erase gate 47 is adjacent to the floating gate via a tunnel insulating film 48 of about 25 nm in thickness. However, thickness of the tunnel insulating film may be varied, however.

In this embodiment, an erase operation is defined as an operation for lowering the threshold voltage of a memory cell by ejecting electrons in the floating gate 42 to the erase gate via the tunnel insulating film 48. The definition of the erase operation is not limited only to that, however. Such an erase operation in this embodiment is performed by ejecting electrons from the floating gate 42 to the erase gate 47, using the F-N tunnel phenomenon by applying a high voltage to the erase gate. The electron election principle is not limited only to that, however. For example, the electron field emission phenomenon may also be used for such an electron ejection.

Figure 22A:
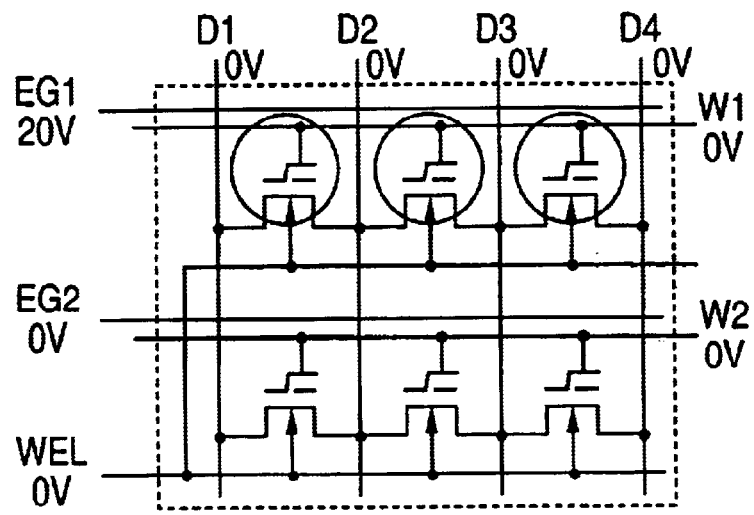
FIG. 22(a) is an explanatory view of an equivalent circuit indicating a configuration of a memory cell array and FIG. 22(b) is a timing flow chart for applied voltages during an erase operation.
Figure 22B:
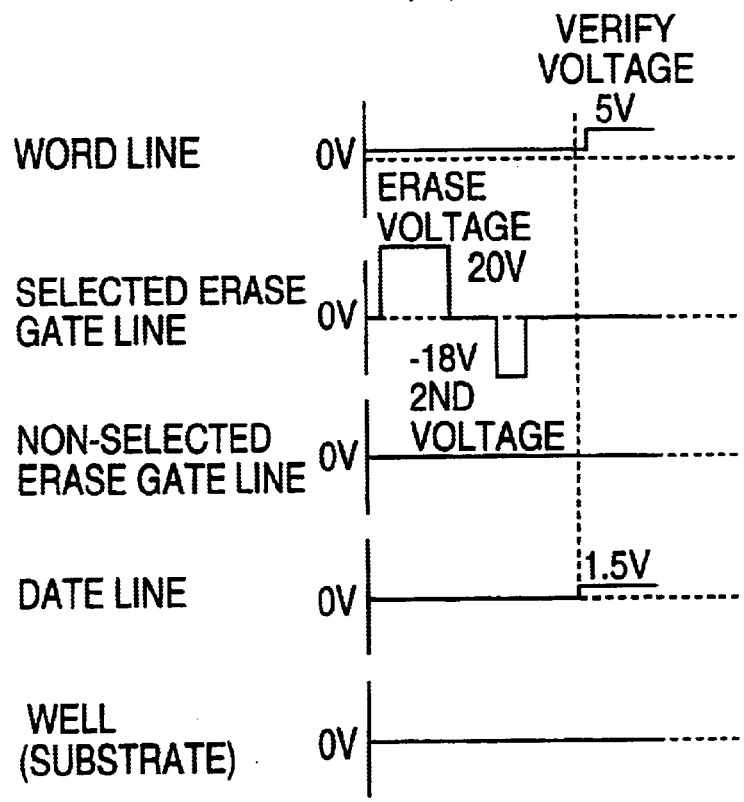

FIG. 22(a) shows an explanatory view of an equivalent circuit of the memory array in this embodiment, and FIG. 22(b) shows a timing flow of the voltages applied in this embodiment. An erase operation is executed as follows. At first, a positive high voltage 20V is applied to a selected erase gate line (e.g., EG1 in FIG. 21(a) as the first operation voltage, which is an erase voltage, as shown in FIG. 22(a) and FIG. 22(b). The word lines W1 and W2, the well line WEL (the substrate 45 if no well is provided), the data lines D1 to D4, and other necessary lines are set to the ground potential, respectively, in order to eject electrons from the floating gate 42 of each predetermined memory cell to the erase gate 47. After this, a negative voltage −18V is applied to the selected erase gate line EG1 as the second operation voltage. With this application of the second operation voltage, the tunnel insulating film 48 is given an electric field with a polarity opposite to that of the electric field given with the application of the first operation voltage. The electrons trapped in the tunnel insulating film 48 can thus be ejected. At this time, the ground potential is retained at lines other than the word lines W1, W2, etc., as well as the selected erase gate line. EG1.

The erase operation can be verified by applying positive voltages 5V and 1.5V to the selected word line W1 and the selected data line, respectively, and setting other lines to the ground potential.

<Ninth Embodiment>

In this embodiment, a program operation for a nonvolatile semiconductor memory device composed of memory cells provided with an erase gate respectively using the operation method of the present invention will be described. The structure of each memory cell in this embodiment is the same as that provided with an erase gate shown in FIG. 21(a) and (b) in the eighth embodiment. Thus, the same reference numerals will be used for the same items as those in FIG. 21 (a) and (b), in order to avoid redundant description. In this embodiment, a program operation is defined as an operation for raising the threshold value of a memory cell by injecting electrons into the floating gate.

In this embodiment, a program operation using the operation method of the present invention for a nonvolatile semiconductor memory device will also be described, that can store four values, that is, 2-bit data, in one memory cell by dividing the amount of electrons stored in the floating gate of each memory cell provided with an erase gate into four levels and storing one storing state in each of those four levels. However, the method for dividing the amount of the electrons stored in the floating gate 42 is not limited only to that. Consequently, the amount of data to be stored in one memory cell is not limited to 2 bits. The flow chart of the program operation in this embodiment is the same as the flow chart. Hereunder the program operation in this embodiment will thus be described with reference to this flow chart shown in FIG. 9.

Figure 23:
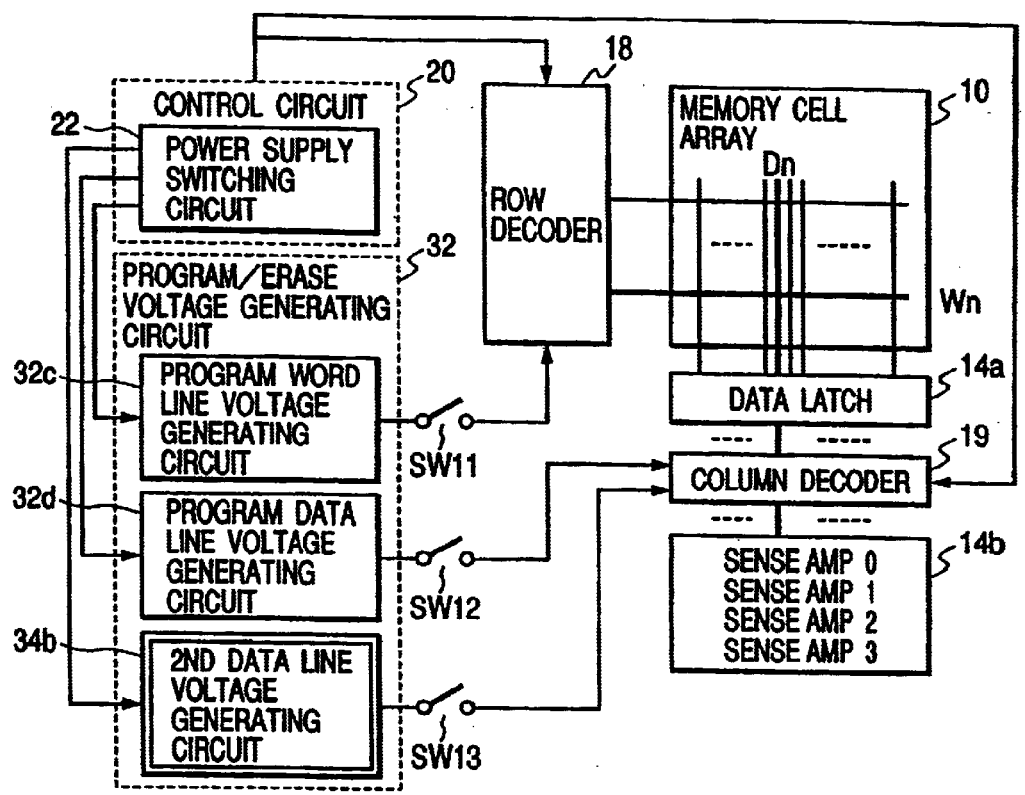
FIG. 23 is also the nonvolatile semiconductor memory device of the present invention in a further embodiment, which explain the operation flow chart shown in FIG. 9 for a program operation of the nonvolatile semiconductor memory device for storing a plurality of storing states in the memory cell provided with the erase gate shown in FIG. 21.
Figure 24:
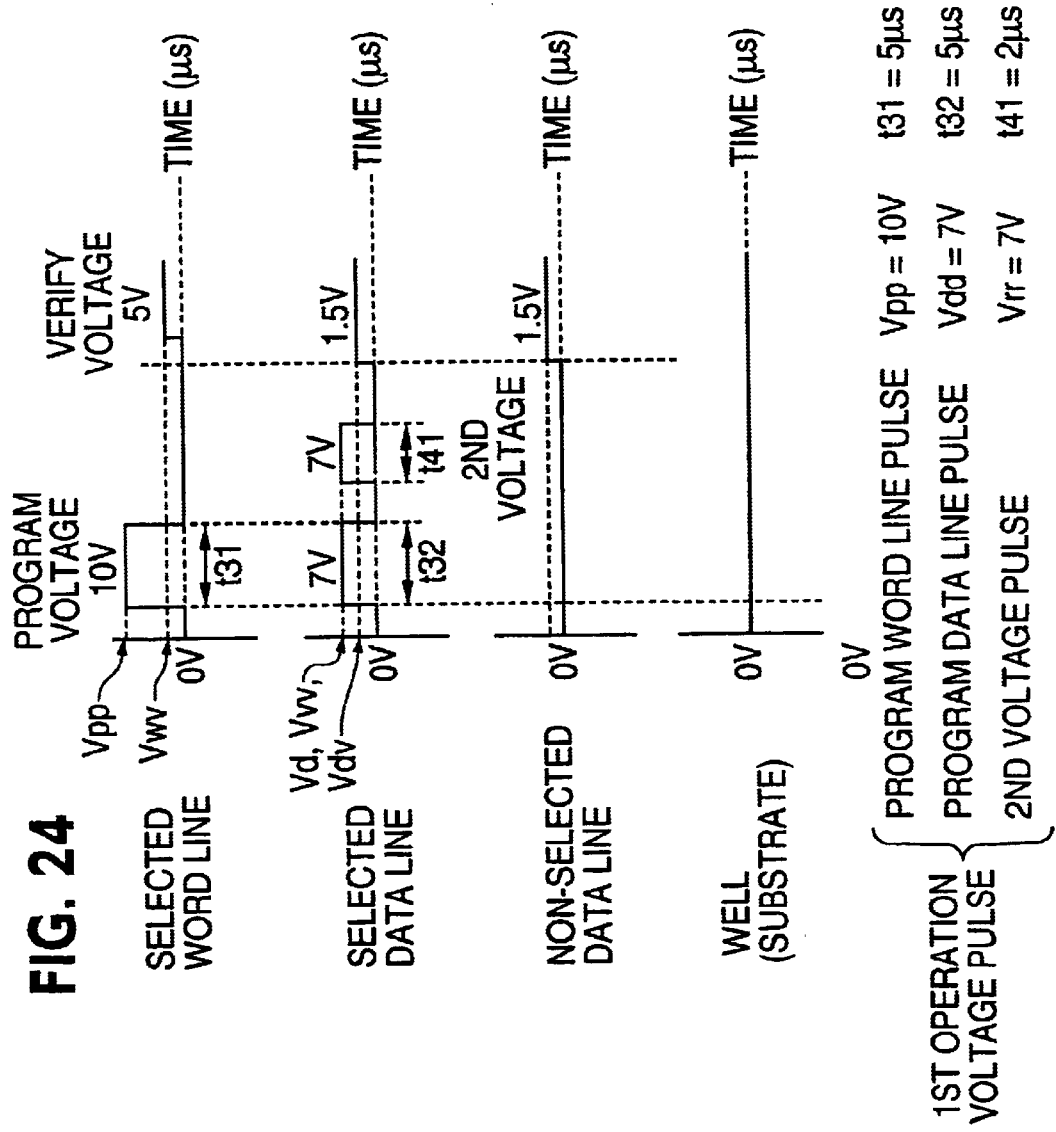
FIG. 24 is an operation method for the nonvolatile semiconductor memory device of the present invention in yet another embodiment. It is also a timing flow chart of applied voltages during a program operation.

The major portion of the block diagram of the nonvolatile semiconductor memory device of the present invention is the same as that shown in FIG. 2. FIG. 23 shows a circuit diagram for describing the memory cell array 10, the control circuit 20, the power supply switching circuit 22, the row decoder 18, the column decoder 19, the sense amplifier/data latch circuit 14, the program/erase voltage generating circuit 32, and the opposite polarity pulse generating circuit 34 in the circuit block diagram shown in FIG. 2, with reference to the operation flow shown in FIG. 9. Especially in FIG. 23, the program word line voltage generating circuit 32c and the program data line voltage generating circuit 32d, provided respectively in the program/erase voltage generating circuit 32, will be shown. The sense amplifier/data latch circuit 14 is divided into a data latch 14a and a sense amplifier 14b, and the opposite polarity pulse generating circuit 34 is shown as the second data line voltage generating circuit 34b. In this embodiment, the configuration of the memory cell array 10 shown in FIG. 10 is the same as the configuration of the equivalent circuit of the memory cell array shown in the explanatory view in FIG. 22(a). FIG. 24 shows a timing flow of the other voltages applied in this embodiment.

When a program operation is started, at first the switches SW11 and SW12 are closed for the word line Wn selected by the row decoder 18 and for the data line Dn selected by the column decoder 19, according to signals from the power supply switching circuit 22 in step S20 in FIG. 9, and thereby the program word line voltage generating circuit 32c and the program data line voltage generating circuit 32d are connected to the word line Wn and the data line Dn, respectively. A program word line pulse having a voltage of Vpp and a pulse width of t31 (e.g., Vpp=10V, t31=5 $\mu$s), and a data line pulse having a voltage of Vdd and a pulse width of t32 (e.g., Vdd=7V, t32=5 $\mu$s), that is, the first operation voltage pulses, are applied to those lines. At this time, a positive voltage Vpp is applied to the control gate of each of a plurality of memory cells connected to the word line Wn. Among those memory cells, a positive voltage is applied to the drain 44 of each memory cell connected to the data line Dn. Consequently, electrons are ejected from the substrate 45 (the well if it is provided) and injected into the floating gate 42 via the gate insulating film 46 due to the hot electron phenomenon. The threshold voltage in each of the memory cells is thus raised. On the other hand, in memory cells connected to lines other than the data line. Dn, almost no electrons are injected, and the threshold voltage in each of them is not raised at all. The switch SW13 is kept open during this time.

After this, the switch SW13 is closed, according to a signal from the power supply switching circuit 22 in step S21, and thereby the second data line voltage generating circuit 34b is connected to the data line Dn. Consequently, the data line Dn is applied with a voltage pulse that gives the gate insulating film 45 an electric field with a polarity opposite to that of the electric field given with the application of the first operation voltage, that is, the second voltage pulse having a voltage of Vrr and a pulse width of t41 (e.g., Vrr=7V, t41=2 $\mu$s) . The switches SW11 and SW12 are kept open during this time.

After this, both data and source lines are set to a predetermined potential, respectively, to verify the threshold voltage of each of the memory cells connected to the word line Wn, and then a predetermined verify voltage Vwv is applied to the word line Wn, and the output current of the data line is sent to the sense amplifier 14b.

In this case, the sense amplifier 14b is composed of four SENSE AMP 0 to 3 into each of which a reference current is entered corresponding to each of the four storing state conditions. The output current of the data line is entered into those four sense amplifiers simultaneously and compared with each other. In other words, a switch (not shown) is closed, according to a signal from the power supply switching circuit 22 in step S22 in order to connect the verify voltage generating circuit 33 to the row decoder 18. Consequently, a predetermined positive verify voltage Vwv is applied to the control gate 41 of each object memory cell, and a predetermined verify voltage Vdv is applied to the drain 44 of the memory cell. The switches SW11 to SW13 are kept open during this time. If the current of the memory cell transistor is determined to be a desired value or over as a result of the verification, that is, if the current does not reach a predetermined program level, control returns to step S20, where the program pulse is again applied to the data line Dn. On the other hand, if the current of the transistor is a desired current value or under, application of the program voltage Vdd to the data line Dn is stopped. The same program operation is repeated for memory cells connected to the selected word line Wn in such a way until the result of "all "0" determination" in step S23 is satisfied, that is, until the program operation up to a desired program level is ended for each of the predetermined memory cells. Then, the program operation is ended.

The circuit configuration in this embodiment is arranged so that four sense amplifiers are provided for one data line, and the output current of an object data line is entered to those amplifiers simultaneously to make a verify operation. Consequently, the program operation can be executed faster for a plurality of memory cells in which a program operation is executed so as to set a plurality of storing states in them than in a circuit configuration in which one sense amplifier is connected to one data line.

The operation methods described in the eighth and ninth embodiments can apply to the flash memory described in, for example, "Symposium on VLSI Circuits Digest of Technical Papers (pp. 24–25, 1992)." In addition, the operation methods can also apply to the flash memory provided with an erase gate for each memory cell, described by Mr. Masuoka and others in "1984 International Electron Devices meeting 17.3 (pp. 464–467) ", since the voltage applied to each selected memory cell during a an erase operation can be considered to be the same as that of the flash memory described by Mr. Mehrotra and others, although the disposition of the memory cells, as well as the detailed structure of each memory cell, differs from that of the flash memory indicated by Mehrotra, etc. Consequently, the application voltage flows shown in FIG. 1(b), FIG. 22(b), and FIG. 24 can apply to those flash memories.

INDUSTRIAL APPLICABILITY

As described in detail in the embodiments described above, according to the nonvolatile semiconductor memory device and its operation method of the present invention, a second voltage generating circuit is provided for generating a voltage whose polarity is opposite to that of the erase or program voltage, which is the first operation voltage, so that after the first operation voltage is applied, the second operation voltage is applied with a polarity opposite to that of the first operation voltage before a verify operation is performed. Consequently, even when the insulating film around the floating film is degraded, due to repetitive program operations, it is possible to suppress the variability of the threshold voltage in each memory cell, which is caused by a leakage of electrons trapped in the insulating film. Consequently, it is also possible to improve the reliability of each memory cell, such as electron retention characteristics and disturb resistance characteristics. In addition, since a proper value can be selected for the second operation voltage, it is possible to suppress the variability of the threshold value in each memory cell, even when the program or erase characteristics are varied among memory cells. With such characteristics, the present invention is effective for improving the reliability of memories, especially multi-value memories.

What is claimed is:

1. A method for operating a nonvolatile semiconductor memory device including a memory cell array composed of a plurality of memory cells, each of which is formed with a gate insulating film, a floating gate electrode, an insulating film between electrode layers, and a control gate formed respectively in a first conductor type semiconductor area, as well as a second conductor type source area and a second conductor type drain area formed respectively in said first conductor type semiconductor area and being used for programming and erasing of data by controlling the amount of electrons in said floating gate electrode, wherein said method includes processes for:

applying a predetermined first operation voltage to a memory cell thereby to inject or eject electrons in or from said floating gate electrode;

applying a second operation voltage to said memory cell after the application of said first operation voltage to give an electric field with a polarity opposite to that of the electric field given with the application of said first operation voltage to an insulating film around said floating gate through which electrons pass when said first operation voltage is applied;

verifying the threshold voltage in said memory cell after the application of said second operation voltage; and deciding whether to repeat said processes following the application of said first operation voltage again after said verify operation.

2. A method for operating a nonvolatile semiconductor memory device in accordance with claim 1, wherein said second operation voltage can give an electric field of at least 7 MV/cm in absolute value to said insulating film area around said floating gate.

3. A method for operating a nonvolatile semiconductor memory device in accordance with claim 1, wherein said second operation voltage has a pulse width shorter than that of said first operation voltage.

4. A method for operating a nonvolatile semiconductor memory device in accordance with claim 1, wherein said process for applying said second operation voltage to said memory cell is executed when the program/erase cycles for said memory cell exceeds a predetermined count.

5. A method for operating a nonvolatile semiconductor memory device in accordance with claim 1, wherein said operation method further includes a process for increasing the pulse width of each of said first and second operation voltages each time said process for applying said first operation voltage is repeated by a predetermined count.

6. A method for operating a nonvolatile semiconductor memory device in accordance with claim 5, wherein said process for increasing the pulse width of said second operation voltage is carried out until the pulse width of said second operation voltage reaches a predetermined value.

7. A method for operating a nonvolatile semiconductor memory device in accordance with claim 1, wherein said operation method further includes a process for increasing the peak value of each of said first and second operation voltages each time said process for applying said first operation voltage to said memory cell is repeated by a predetermined count.

8. A method for operating a nonvolatile semiconductor memory device in accordance with claim 7, wherein said process for increasing the peak value of said second operation voltage is carried out until the peak value of said second operation voltage reaches a predetermined value.

9. A method for operating a nonvolatile semiconductor memory device in accordance with claim 1, wherein said first operation voltage is a positive polarity voltage with respect to the ground potential and applied to a predetermined word line and said substrate is applied the ground potential or a negative polarity potential with respect to the ground potential, and said second operation voltage is a negative polarity voltage with respect to the ground potential and applied to said word line.

10. A method for operating a nonvolatile semiconductor memory device in accordance with claim 1, wherein said first operation voltage is a positive polarity voltage with respect to the ground potential and applied to a predetermined word line and said substrate is applied the ground potential or a negative polarity potential with respect to the ground potential, and said second operation voltage is a positive polarity voltage with respect to the ground potential and applied to said substrate.

11. A method for operating a nonvolatile semiconductor memory device in accordance with claim 1, wherein said first operation voltage is a positive polarity voltage with respect to the ground potential and applied to said substrate and said second operation voltage is a positive polarity voltage with respect to the ground potential and applied to one or more word lines.

12. A method for operating a nonvolatile semiconductor memory device in accordance with claim 1, wherein said first operation voltage is a negative polarity voltage with respect to the ground potential and applied to a predetermined word line and said substrate is applied the ground potential or a positive polarity potential with respect to the ground potential, and said second operation voltage is a positive polarity voltage with respect to the ground potential and applied to said word line.

13. A method for operating a nonvolatile semiconductor memory device in accordance with claim 1, wherein said memory cell can be varied in peak value or in pulse width of said second operation voltage for a program or erase operation according to a program level so that said memory cell can store data of a plurality of bits when the threshold voltage of said memory cell is set to one of a plurality of program or erase levels.

14. A method for operating a nonvolatile semiconductor memory device including a memory cell array composed of a plurality of memory cells, each of which is formed with a gate insulating film, a floating gate electrode, an insulating film between electrodes, a control gate electrode, and an erase gate electrode formed respectively in a first conductor type semiconductor area, as well as a second conductor type source area and a second conductor type drain area formed respectively in said first conductor type semiconductor area, and programming and erasing data by controlling the amount of electrons stored in said floating gate, comprising processes:

applying a predetermined first operation voltage to said memory cell thereby to inject or eject electrons in or from said floating gate electrode;

applying a second operation voltage to said memory cell after the application of said first operation voltage to give an electric field with a polarity opposite to that of the electric field given with the application of said first operation voltage to an insulating film area around said floating gate through which electrons pass when said first operation voltage is applied;

verifying the threshold voltage in said memory cell after the application of said second operation voltage; and deciding whether to repeat said operations following the application of said first operation voltage after said verify operation, wherein said operation method carries out a program or erase operation at least once for said memory cell.

15. A method for operating a nonvolatile semiconductor memory device in accordance with claim 14, wherein said second operation voltage can apply an electric field of, at least, 7 MV/cm in absolute value to said insulating film area around said floating gate.

16. A method for operating a nonvolatile semiconductor memory device in accordance with claim 14, wherein said second operation voltage has a pulse width shorter than that of said first operation voltage.

17. A method for operating a nonvolatile semiconductor memory device in accordance with claim 14, wherein said process for applying said second operation voltage to said memory cell is carried out when the program/erase cycles for said memory cell exceeds a predetermined count.

18. A method for operating a nonvolatile semiconductor memory device in accordance with claim 14, wherein said method further includes a process for increasing the pulse width of each of said first and second operation voltages each time said process for applying said first operation voltage to said memory cell is repeated by a predetermined count.

19. A method for operating a nonvolatile semiconductor memory device in accordance with claim 18, wherein said process for increasing the pulse width of said second operation voltage is carried out until the pulse width of said second operation voltage reaches a predetermined value.

20. A method for operating a nonvolatile semiconductor memory device in accordance with claim 14, wherein said operation method further includes a process for increasing the peak value of each of said first and second operation voltages each time said process for applying said first operation voltage to said memory cell is repeated by a predetermined count.

21. A method for operating a nonvolatile semiconductor memory device in accordance with claim 20, wherein said process for increasing the peak value of said second operation voltage is carried out until the peak value of said second operation voltage reaches a predetermined value.

22. A method for operating a nonvolatile semiconductor memory device in accordance with claim 14, wherein said first-operation voltage has a positive polarity with respect to the ground potential and applied to a predetermined erase gate thereby to eject electrons from said floating gate electrode, said substrate is applied the ground potential or a negative polarity potential with respect to the ground potential, and said second operation voltage has a negative polarity with respect to the ground potential to be applied to said erase gate.

* * * * *